(12) United States Patent
Liu et al.

(10) Patent No.: US 11,361,703 B2
(45) Date of Patent: Jun. 14, 2022

(54) GATE DRIVING UNIT INCLUDING FOUR CLOCK SIGNALS, GATE DRIVING METHOD, GATE DRIVING CIRCUIT, DISPLAY PANEL AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Peng Liu, Beijing (CN); Bailing Liu, Beijing (CN); Fuqiang Li, Beijing (CN); Zhichong Wang, Beijing (CN); Jing Feng, Beijing (CN); Xinglong Luan, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 16/650,306

(22) PCT Filed: Mar. 28, 2019

(86) PCT No.: PCT/CN2019/080015
§ 371 (c)(1),
(2) Date: Mar. 24, 2020

(87) PCT Pub. No.: WO2020/191695
PCT Pub. Date: Oct. 1, 2020

(65) Prior Publication Data
US 2021/0241673 A1 Aug. 5, 2021

(51) Int. Cl.
*G09G 5/00* (2006.01)
*G09G 3/20* (2006.01)
(Continued)

(52) U.S. Cl.
CPC ......... *G09G 3/2092* (2013.01); *G09G 3/3266* (2013.01); *G09G 3/3674* (2013.01);
(Continued)

(58) Field of Classification Search
CPC ......... G09G 3/2092; G09G 2300/0426; G09G 2310/0267; G09G 2310/061;
(Continued)

(56) References Cited

U.S. PATENT DOCUMENTS

2010/0316182 A1* 12/2010 Lai .................. G11C 19/28
377/79
2011/0129052 A1 6/2011 Chiang
(Continued)

FOREIGN PATENT DOCUMENTS

CN 102081969 A 6/2011
CN 104882107 A 9/2015
(Continued)

OTHER PUBLICATIONS

First Office Action for Chinese Application No. 201980000405.6 dated May 6, 2022, 15 Pages.

*Primary Examiner* — Adam J Snyder
(74) *Attorney, Agent, or Firm* — Brooks Kushman P.C.

(57) ABSTRACT

A gate driving unit, a gate driving method, a gate driving circuit, a display panel and a display device are provided. The gate driving unit includes a start terminal, a first gate driving signal output terminal, a second gate driving signal output terminal, a pull-up control node control circuit, a pull-up node control circuit, configured to control a potential of a first pull-up node and a potential of a second pull-up node based on the potential of the pull-up control node, a first gate driving signal output circuit, a second gate driving signal output circuit, and a pull-down node control circuit, configured to control and maintain the potential of the
(Continued)

pull-down node under the control of a third clock signal and a fourth clock signal, and control to reset the potential of the pull-down node under the control of the potential of the pull-up control node.

19 Claims, 10 Drawing Sheets

(51) Int. Cl.
  *G11C 19/28* (2006.01)
  *G09G 3/3266* (2016.01)
  *G09G 3/36* (2006.01)
(52) U.S. Cl.
  CPC ............... *G09G 2300/0426* (2013.01); *G09G 2310/0267* (2013.01); *G09G 2310/0286* (2013.01); *G09G 2310/061* (2013.01); *G09G 2310/08* (2013.01); *G09G 2330/021* (2013.01); *G11C 19/28* (2013.01)
(58) Field of Classification Search
  CPC ......... G09G 2310/08; G09G 2330/021; G09G 3/3266; G09G 3/3674; G09G 2310/0286; G11C 19/28
  See application file for complete search history.

(56) References Cited

U.S. PATENT DOCUMENTS

| | | | |
|---|---|---|---|
| 2013/0057525 A1* | 3/2013 | Miyamoto | G09G 3/3677 345/204 |
| 2013/0077736 A1* | 3/2013 | Son | G09G 3/2085 377/69 |
| 2014/0079173 A1* | 3/2014 | Yan | G11C 19/28 377/64 |
| 2015/0054818 A1 | 2/2015 | Cho et al. | |
| 2015/0269899 A1* | 9/2015 | Ma | G09G 3/3674 345/213 |
| 2015/0332784 A1* | 11/2015 | Yan | G09G 3/3677 377/64 |
| 2016/0049128 A1* | 2/2016 | Shao | G09G 3/3677 345/204 |
| 2016/0086562 A1* | 3/2016 | Tan | G09G 3/3677 345/215 |
| 2016/0351156 A1* | 12/2016 | Wu | G09G 3/3677 |
| 2016/0365054 A1* | 12/2016 | Wu | G09G 3/3677 |
| 2017/0061862 A1 | 3/2017 | Dun | |
| 2017/0076680 A1* | 3/2017 | Li | G09G 3/20 |
| 2017/0124974 A1 | 5/2017 | Cao | |
| 2017/0269769 A1* | 9/2017 | Hu | G06F 3/04166 |
| 2017/0330526 A1* | 11/2017 | Fan | G09G 3/3677 |
| 2018/0122318 A1 | 5/2018 | Cao | |
| 2018/0122320 A1* | 5/2018 | Sasaki | G09G 3/3688 |
| 2019/0006018 A1 | 1/2019 | Fang et al. | |
| 2019/0064978 A1* | 2/2019 | Tu | G06F 3/04164 |
| 2019/0129562 A1 | 5/2019 | Li et al. | |
| 2019/0156730 A1* | 5/2019 | Lim | G09G 3/3677 |
| 2019/0385556 A1* | 12/2019 | Guan | G09G 3/20 |

FOREIGN PATENT DOCUMENTS

| | | |
|---|---|---|
| CN | 105047228 A | 11/2015 |
| CN | 105096865 A | 11/2015 |
| CN | 105390102 A | 3/2016 |
| CN | 105761758 A | 7/2016 |
| CN | 106023876 A | 10/2016 |
| CN | 106601175 A | 4/2017 |
| CN | 206340328 U | 7/2017 |
| CN | 107731170 A | 2/2018 |
| CN | 20748450 U | 6/2018 |
| CN | 109064964 A | 12/2018 |
| KR | 100659712 B1 | 12/2006 |
| KR | 20150002030 A | 1/2015 |

* cited by examiner

GATE DRIVING UNIT INCLUDING FOUR CLOCK SIGNALS, GATE DRIVING METHOD, GATE DRIVING CIRCUIT, DISPLAY PANEL AND DISPLAY DEVICE

CROSS-REFERENCE TO RELATED APPLICATIONS

This application is the U.S. national phase of PCT Application No. PCT/CN2019/080015 filed on Mar. 28, 2019, which is incorporated herein by reference in its entirety.

TECHNICAL FIELD

The present disclosure relates to the field of display driving technology, in particular to a gate driving unit, a gate driving method, a gate driving circuit, a display panel and a display device.

BACKGROUND

Mobile products are updated very quickly, and the development terminal of the mobile products are thinner, lighter, and ultra-long standby. From the perspective of customer experience, the requirements for the screen bezels are becoming narrower and the standby time is becoming longer. Therefore, it is required to develop a gate driving circuit provided on an array substrate (Gate On Array, GOA) that supports narrow bezels, strong driving ability, and does not increase the flicker (blink) under low frequency and low power consumption conditions. It will facilitate to increase device competitiveness.

The traditional gate driving unit can only drive one gate line. The quantity of the gate driving units is the same as the quantity of gate lines. Especially for large-size and high-resolution display panels, in order to avoid the inconsistency between the far-terminal and near-terminal loads of the gate driving unit output caused by unilateral driving, which causes insufficient charging or uniform charging due to different charging capabilities of pixels at the far-terminal and the near-terminal. Display products with bilateral driving can solve the problem of inconsistent driving capabilities, but the gate driving units having a same quantity as that of gate lines on both sides are required, which causes the size of the display panel frame to be too large.

In addition, as the resolution of display products is getting higher and higher, the power consumption also increases with the increase of resolution, and the standby time is greatly reduced. In order to overcome the reduction of standby time due to too large resolution, and reduce power consumption, it is a valid way to reduce the refresh frequency of the display device so as to significantly reduce power consumption. However, the reduction of the refresh frequency will cause the occurrence of high flicker.

SUMMARY

In a first aspect, the present disclosure provides in some embodiments a gate driving unit, including a start terminal, a first gate driving signal output terminal, a second gate driving signal output terminal, a pull-up control node control circuit, configured to control and maintain a potential of a pull-up control node to be a valid voltage under the control of a start signal inputted by a start terminal, and control the potential of the pull-up control node to be an invalid voltage under the control of a potential of a pull-down node; a pull-up node control circuit, configured to control a potential of a first pull-up node and a potential of a second pull-up node based on the potential of the pull-up control node; a first gate driving signal output circuit, configured to control the connection of a first gate driving signal output terminal and a first clock signal terminal under the control of the potential of the first pull-up node, and control to reset a first gate driving signal outputted from the first gate driving signal output terminal under the control of the potential of the pull-down node; a second gate driving signal output circuit, configured to control the connection of a second gate driving signal output terminal and a second clock signal terminal under the control of the potential of the second pull-up node, and control to reset the second gate driving signal outputted from the second gate driving signal output terminal under the control of the potential of the pull-down node; and a pull-down node control circuit, configured to control and maintain the potential of the pull-down node under the control of a third clock signal inputted by a third clock signal terminal and a fourth clock signal inputted by a fourth clock signal terminal, and control to reset the potential of the pull-down node under the control of the potential of the pull-up control node.

Optionally, the start terminal comprises a start terminal of odd-numbered rows and a start terminal of even-numbered rows, the pull-up control node control circuit is configured to control and maintain the potential of the pull-up control node to be a valid voltage when a valid voltage is inputted by the start terminal of odd-numbered rows, and control and maintain the potential of the pull-up control node to be a valid voltage when a valid voltage is inputted by the start terminal of even-numbered rows, and control the potential of the pull-up control node to be an invalid voltage when the potential of the pull-down node is a valid voltage.

Optionally, the pull-up control node control circuit includes: a first transistor, a control electrode thereof being connected to the start terminal of odd-numbered rows, a first electrode thereof being connected to the first voltage terminal, and a second electrode thereof being connected to the pull-up control node; a second transistor, a control electrode thereof being connected to the start terminal of even-numbered rows, a first electrode thereof being connected to the first voltage terminal, and a second electrode thereof being connected to the pull-up control node; a pull-up control node pull-down transistor, a control electrode thereof being connected to the pull-down node, a first electrode thereof being connected to the pull-up control node, and a second electrode thereof being connected to a second voltage terminal; and a pull-up control node maintenance capacitor, a first end thereof being connected to the pull-up control node, and a second end thereof being connected to a third voltage terminal.

Optionally, the start terminal comprises a forward start terminal of odd-numbered rows, a reverse start terminal of odd-numbered rows, a forward start terminal of even-numbered rows and a reverse start terminal of even-numbered rows; the gate driving unit further comprises a forward scan control terminal and a reverse scan control terminal, the pull-up control node control circuit is configured to, during the forward scanning, under the control of the forward scanning control signal inputted by the forward scanning control terminal, when the valid voltage is inputted by the forward start terminal of the odd-numbered rows, control the potential of the pull-up control node to be a valid voltage, and when a valid voltage is inputted by the forward start terminal of even-numbered rows, control and maintain the potential of the pull-up control node as a valid voltage; the pull-up control node control circuit is configured to, during the reverse scanning, under the control of the reverse scanning control signal inputted by the reverse scanning control terminal, when the valid voltage is inputted by the reverse start terminal of odd-numbered rows, control the potential of the pull-up control node to be a valid voltage, and when the valid voltage is inputted by the reverse start terminal of even-numbered rows, control and maintain the potential of the pull-up control node as a valid voltage; and the pull-up control node control circuit is further configured to control the potential of the pull-up control node to an invalid voltage when the potential of the pull-down node is a valid voltage.

Optionally, the pull-up control node control circuit includes: a first forward scanning control transistor, a control electrode thereof being connected to the forward scanning control terminal, and a first electrode thereof being connected to the forward start terminal of odd-numbered rows; a second forward scan control transistor, a control electrode thereof being connected to the forward scan control terminal, and a first electrode thereof being connected to the forward start terminal of even-numbered rows; a first reverse scan control transistor, a control electrode thereof being connected to the reverse scan control terminal, a first electrode thereof being connected to a control electrode of a first pull-up control node control transistor, and a second electrode thereof being connected to the reverse start terminal of odd-numbered rows; a second reverse scan control transistor, a control electrode thereof being connected to the reverse scan control terminal, a first electrode thereof being connected to a control electrode of a second pull-up control node control transistor, and a second electrode thereof being connected to the reverse start terminal of even-numbered rows; a first pull-up control node control transistor, a control electrode thereof being connected to a second electrode of the first forward scan control transistor, a first electrode thereof being connected to the first voltage terminal, and a second electrode thereof being connected to the pull-up control node; a second pull-up control node control transistor, a control electrode thereof being connected to the second electrode of the second forward scan control transistor, the first electrode thereof being connected to the first voltage terminal, and the second electrode thereof being connected to the pull-up control node; a pull-up control node pull-down transistor, a control electrode thereof being connected to the pull-down node, a first electrode thereof being connected to the pull-up control node, and a second electrode thereof being connected to a second voltage terminal; and a pull-up control node maintenance capacitor, a first end thereof being connected to the pull-up control node, and a second end thereof being connected to a third voltage terminal.

Optionally, the gate driving unit further includes a reset circuit, the reset circuit is configured to control the potential of the pull-down node to be a valid voltage under the control of a blank area reset signal inputted by a blank area reset terminal.

Optionally, the pull-up node control circuit includes: a first pull-up node control transistor, a control electrode thereof being connected to a first voltage terminal, a first electrode thereof being connected to the first pull-up node, and a second electrode thereof being connected to the pull-up control node; and a second pull-up node control transistor, a control electrode thereof being connected to the first voltage terminal, a first electrode thereof being connected to the second pull-up node, and a second electrode thereof being connected to the pull-up control node.

Optionally, the pull-down node control circuit includes: a first pull-down node control transistor, both a control electrode and a first electrode thereof being connected to the third clock signal terminal, and a second electrode thereof being connected to the pull-down node; a second pull-down node control transistor, both a control electrode and a second electrode thereof being connected to the fourth clock signal terminal, and the first electrode thereof being connected to the pull-down node; a third pull-down node control transistor, a control electrode thereof being connected to the pull-up control node, a first electrode thereof being connected to the pull-down node, and a second electrode thereof being connected to a second voltage terminal; and a pull-down node maintenance capacitor, a first end thereof being connected to the pull-down node, and a second end thereof being connected to a fourth voltage terminal.

Optionally, the first gate driving signal output circuit comprises a first output transistor and a first output pull-down transistor; a control electrode of the first output transistor is connected to the first pull-up node, a first electrode of the first output transistor is connected to the first clock signal terminal, and a second electrode of the first output transistor is connected to the first gate driving signal output terminal; a control electrode of the first output pull-down transistor is connected to the pull-down node, a first electrode of the first output pull-down transistor is connected to the first gate driving signal output terminal, and a second electrode of the first output pull-down transistor is connected to the second voltage terminal.

Optionally, the second gate driving signal output circuit comprises a second output transistor and a second output pull-down transistor, a control electrode of the second output transistor is connected to the second pull-up node, the first electrode of the second output transistor is connected to the second clock signal terminal, and the second electrode of the second output transistor is connected to the second gate driving signal output terminal, a control electrode of the second output pull-down transistor is connected to the pull-down node, a first electrode of the second output pull-down transistor is connected to the second gate driving signal output terminal, and a second electrode of the second output pull-down transistor is connected to the second voltage terminal.

Optionally, the gate driving unit further includes a touch output control circuit, the touch output control circuit is configured to control both the first gate driving signal output terminal and the second gate driving signal output terminal to output an invalid voltage under the control of a touch output control signal inputted by the touch output control terminal.

Optionally, the gate driving unit further includes a screen off control circuit, the screen off control circuit is configured to control both the first gate driving signal output terminal and the second gate driving signal output terminal to output a valid voltage under the control of a screen off control signal inputted by the screen off control terminal.

In a second aspect, a gate driving method for driving the gate driving unit is disclosed. A frame of display time comprises a first display period and a second display period, and the first display period comprises a first input phase and a first output phase in sequence; the second display period comprises a second input phase and a second output phase in sequence; and the gate driving method includes: in the first input phase and the second input phase, controlling, by the pull-up control node control circuit, the potential of the pull-up control node to be a valid voltage under the control of the start signal, and controlling, by the pull-up node control circuit, the potential of the first pull-up node and the potential of the second pull-up node to be valid voltages based on the potential of the pull-up control node; in the first output phase, maintaining, by the pull-up control node control circuit, the potential of the pull-up control node as a valid voltage, the valid voltage being inputted by the first clock signal terminal, and controlling, by the first gate driving signal output circuit, the connection of the first gate driving signal output terminal and the first clock signal terminal under the potential of the first pull-up node, to control the first gate driving signal output terminal to output a valid voltage; in the second output phase, maintaining, by the pull-up control node control circuit, the potential of the pull-up control node as a valid voltage, a valid voltage being inputted by the second clock signal terminal, and controlling, by the second gate driving signal output circuit, the connection of the second gate driving signal output terminal and the second clock signal terminal under the control of the potential of the second pull-up node, to control the second gate driving signal output terminal to output a valid voltage.

Optionally, the first display period further includes a first output reset phase and a first pull-down node control phase set after the first output phase, and the second display period further comprises the second output reset phase and the second pull-down node control phase set after the second output phase, the gate driving method further includes: in the first output reset phase, maintaining, by the pull-up control node control circuit, the potential of the pull-up control node as a valid voltage, an invalid voltage being inputted by the first clock signal terminal, and controlling, by the first gate driving signal output circuit, the connection of the first gate driving signal output terminal and the first clock signal terminal under the control of the potential of the first pull-up node, to control the first gate driving signal output terminal to output an invalid voltage; in the first pull-down node control phase, a valid voltage being inputted by the third clock signal terminal, controlling, by the pull-down node control circuit, the voltage of the pull-down node to be a valid voltage under the control of the third clock signal, and controlling, by the first gate driving signal output circuit, to reset the first gate driving signal outputted from the first gate driving signal output terminal under the control of the potential of the pull-down node; in the second output reset phase, maintaining, by the pull-up control node control circuit, the potential of the pull-up control node as a valid voltage, an invalid voltage being inputted by the second clock signal terminal, and controlling, by a second gate driving signal output circuit, the connection of the second gate driving signal output terminal and the second clock signal terminal under the control of the potential of the second pull-up node, to control the second gate driving signal output terminal to output an invalid voltage; and in the second pull-down node control phase, the valid voltage being inputted by the fourth clock signal terminal, controlling, by the pull-down node control circuit, the voltage of the pull-down node to be a valid voltage under the control of the fourth clock signal, and controlling, by the second gate driving signal output circuit, to reset the second gate driving signal outputted from the second gate driving signal output terminal under the control of the potential of the pull-down node.

Optionally, the first display period further includes a first output cutoff maintenance phase set after the first pull-down node control phase, and the second display period further comprises a second output cut-off maintenance phase set after the second pull-down node control phase, the gate driving method further includes: in the first output cut-off maintenance phase, maintaining, by the pull-down node control circuit, the voltage of the pull-down node as a valid voltage, and controlling, by the first gate driving signal output circuit, to reset the first gate driving signal outputted from the first gate driving signal output terminal under the control of the potential of the pull-down node; and in the second output cut-off maintenance phase, maintaining, by the pull-down node control circuit, the voltage of the pull-down node as a valid voltage, and controlling, by the second gate driving signal output circuit, to reset the second gate driving signal outputted from the second gate driving signal output terminal under the control of the potential of the pull-down node.

Optionally, the gate driving method further includes: in the first input phase and the second input phase, an invalid voltage being inputted by the first clock signal terminal and the second clock signal terminal, and controlling, by the first gate driving signal output circuit, the connection of the first gate driving signal output terminal and the first clock signal terminal under the control of the potential of the first pull-up node, to control the first gate driving signal output terminal to output an invalid voltage, and controlling, by the second gate driving signal output circuit, the connection of the second gate driving signal output terminal and the second clock signal terminal under the control of the potential of the second pull-up node, to control the second gate driving signal output terminal to output an invalid voltage; in the first output phase, a valid voltage being inputted by the second clock signal terminal, and controlling, by the second gate driving signal output circuit, the connection of the second gate driving signal output terminal and the second clock signal terminal under the control of the potential of the second pull-up node, to control the second gate driving signal output terminal to output an invalid voltage; in the second output phase, a valid voltage being inputted by the first clock signal terminal, and controlling, by the first gate driving signal output circuit, the connection of the first gate driving signal output terminal and the first clock signal terminal under the control of the potential of the first pull-up node, to control the first gate driving signal output terminal to output an invalid voltage.

Optionally, the gate driving unit further includes a reset circuit, and the gate driving method further incudes: setting a blank phase between two display periods, controlling, by the reset circuit, the potential of the pull-down node to be a valid voltage under the control of a blank area reset signal inputted by the blank area reset terminal.

In a third aspect, a gate driving circuit includes a plurality of stages of the gate driving unit.

Optionally, the start terminal comprises a start terminal of even-numbered rows and a start terminal of even-numbered rows, except for a first stage of gate driving unit, the start terminal of odd-numbered rows of a current stage of the gate driving unit is connected to the first gate driving signal output terminal of an adjacent previous-stage of gate driving unit, the start terminal of the even-numbered rows of a current stage of gate driving unit is connected to the second gate driving signal output terminal of an adjacent previous-stage of gate driving unit; the start terminal of the odd-numbered rows of the first-stage of gate driving unit is connected to the first start signal input terminal, and the start terminal of the even-numbered rows of the first-stage of gate driving unit is connected to the second start signal input terminal.

Optionally, the start terminal comprises a forward start terminal of odd-numbered rows, a reverse start terminal of odd-numbered rows, a forward start terminal of even-numbered rows, and a reverse start terminal of even-numbered rows, the gate driving unit comprises a forward scanning control terminal and a reverse scanning control terminal;

except for the first-stage of gate driving unit, the forward star terminal of odd-numbered rows of a current stage of the gate driving unit is connected to the first gate driving signal output terminal of an adjacent previous-stage of gate driving unit, and the start terminal of even-numbered rows of a current stage of the gate driving unit is connected to the second gate driving signal output terminal of the adjacent previous-stage of gate driving unit; the forward start terminal of the odd-numbered rows of the first-stage of gate driving unit is connected to the first forward start signal input terminal, and the forward start terminal of the even-numbered rows of the first-stage of gate driving unit is connected to the second forward start signal input terminal; except for the last-stage of gate driving unit, the reverse start terminal of odd-numbered rows of a current stage of gate driving unit is connected to the first gate driving signal output terminal of the adjacent next-stage of gate driving unit, the reverse start terminal of the even-numbered rows of a current stage of the gate driving unit is connected to the second gate driving signal output terminal of the adjacent next-stage of gate driving unit; the reverse start terminal of odd-numbered rows of the last-stage of gate driving unit is connected to the first reverse start signal input terminal, and the reverse start terminal of even-numbered rows of the last-stage of gate driving unit is connected to the second reverse start signal input terminal.

Optionally, the first clock signal terminal of the (2n-1)th stage of gate driving unit is connected to the first clock signal input terminal, and the second clock signal terminal of the (2n-1)th stage of gate driving unit is connected to the second clock signal input terminal, the first clock signal terminal of the (2n-1)th stage of gate driving unit is connected to the fifth clock signal input terminal, the second clock signal terminal of the (2n-1)th stage of gate driving unit is connected to the sixth clock signal input terminal; the first clock signal terminal of the (2n)th stage of gate driving unit is connected to a third clock signal input terminal, the second clock signal terminal of the (2n)th stage of gate driving unit is connected to a fourth clock signal input terminal, the first clock signal terminal of the (2n)th stage of gate driving unit is connected to a seventh clock signal input terminal, the second clock signal terminal of the (2n)th stage of gate driving unit is connected to an eighth clock signal input terminal, wherein n is a positive integer.

In a fourth aspect, a gate driving method applied to a gate driving circuit is provided. A frame of image display time comprises a first display period and a second display period, the gate driving method includes: in the first display period, all stages of gate driving units included in the gate driving circuit outputting stage by stage a valid voltage through first gate driving signal output terminals thereof in the second display period, all stages of gate driving units included in the gate driving circuit outputting stage by stage a valid voltage through second gate driving signal output terminals thereof.

Optionally, the first display period comprises M display phases that are sequentially set, and the second display period comprises M display phases that are sequentially set, M is a total number of stages of the gate driving units included in the gate driving circuit, the gate driving method comprises: during forward scanning, in the m-th display phase in the first display period, the m-th gate driving unit included in the gate driving circuit outputting a valid voltage through its first gate driving signal output terminal; in the m-th display phase in the second display period, the m-th gate driving unit included in the gate driving circuit outputting a valid voltage through its second gate driving signal output terminal; M is an integer greater than 1, and m is a positive integer less than or equal to M.

Optionally, the first display period comprises M display phases that are sequentially set, and the second display period comprises M display phase that are sequentially set, M is a total number of stages of the gate driving units included in the gate driving circuit, the gate driving method includes: during reverse scanning, in the m-th display phase in the first display period, the (M-m+1)th stage of gate driving unit included in the gate driving circuit outputting a valid voltage through its first gate driving signal output terminal; in the m-th display phase in the second display period, the (M-m+1)th stage of gate driving unit included in the gate driving circuit outputting a valid voltage through its second gate driving signal output terminal; M is an integer greater than 1, and m is a positive integer less than or equal to M.

In a fifth aspect, a display panel includes a display substrate, gate lines in M rows arranged on the display substrate and the gate driving circuit, M is the total number of stages of gate driving units included in the gate driving circuit, the first gate driving signal output terminal of the m-th stage of gate driving unit of the gate driving circuit is connected to a gate line in the (2m-1)th row; the second gate driving signal output terminal of the m-th stage of gate driving unit of the gate driving circuit is connected to a gate line in (2m)th row; M is an integer greater than 1, and m is a positive integer less than or equal to M.

In sixth aspect, a display panel includes a display substrate, gate lines in M rows arranged on the display substrate and two gate driving circuits, M is the total number of stages of gate driving units included in the gate driving circuit, the first gate driving signal output terminal of the m-th stage of gate driving unit of the first gate driving circuit is connected to a left terminal of the gate line in the (2m-1)th row; the second gate driving signal output terminal of the m-th stage of gate driving unit of the first gate driving circuit is connected to a left terminal of the gate line in the (2m)th row; the first gate driving signal output terminal of the m-th stage of gate driving unit of the second gate driving circuit is connected to a right terminal of the gate line in the (2m-1)th row; and the second gate driving signal output terminal of the m-th stage of gate driving unit of the second gate driving circuit is connected to a right terminal of the gate line in the (2m)th row; M is an integer greater than 1, and m is a positive integer less than or equal to M In the seventh aspect, a display device includes the display panel.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The transistors used in all the embodiments of the present disclosure may be transistors, thin film transistors or field effect transistors or other devices with the same characteristics. In the embodiment of the present disclosure, in order to distinguish the two electrodes of the transistor other than the control electrode, one of the electrodes is called a first electrode and the other electrode is called a second electrode.

In actual operation, for a transistor, the control electrode may be a base, the first electrode may be a collector, and the second electrode may be an emitter; or the control electrode may be a base, the first electrode may be an emitter, and the second electrode may be a collector.

In actual operation, for a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

Figure 1:
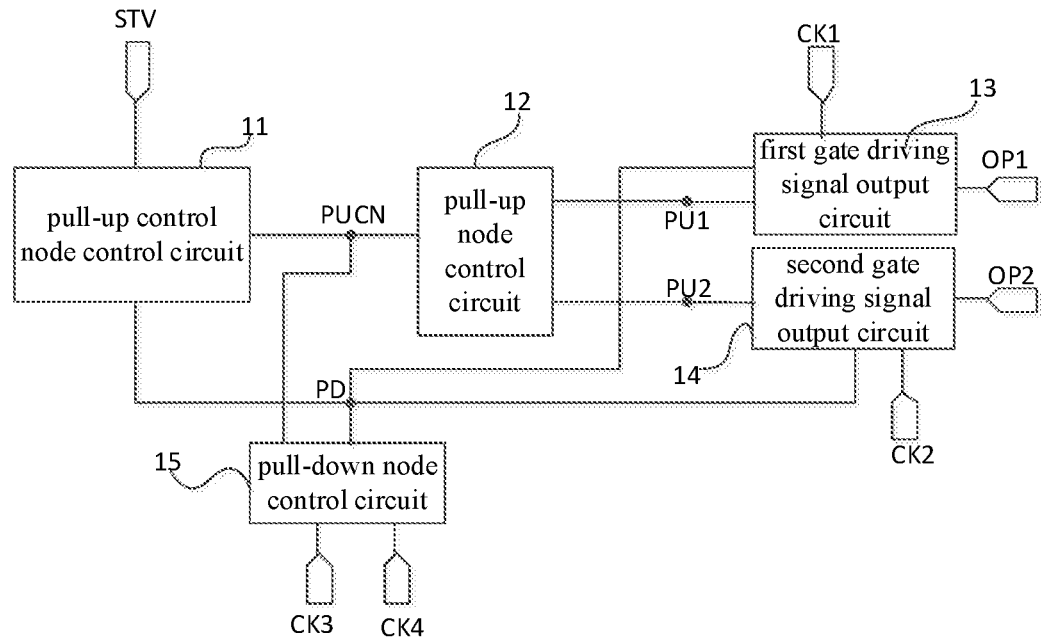
FIG. 1 is a structural diagram of a gate driving unit according to at least one embodiment of the present disclosure.

As shown in FIG. 1, the gate driving unit according to at least one embodiment of the present disclosure includes a start terminal STV, a first gate driving signal output terminal OP1, a second gate driving signal output terminal OP2, and a pull-up control node control circuit 11, a pull-up node control circuit 12, a first gate driving signal output circuit 13, a second gate driving signal output circuit 14, and a pull-down node control circuit 15.

The pull-up control node control circuit 11 is respectively connected to the start terminal STV, a pull-up control node PUCN, and a pull-down node PD, and is configured to control and maintain the potential of the pull-up control node PUCN to be a valid voltage under the control of a start signal input by the start terminal STV, and control the potential of the pull-up control node PUCN to be an invalid voltage under the control of the potential of the pull-down node PD.

The pull-up node control circuit 12 is connected to the pull-up control node PUCN, the first pull-up node PU1, and the second pull-up node PU2, respectively, and is configured to control the potential of a first pull-up node PU1 and the potential of a second pull-up node PU2 based on the potential of the pull-up control node PUCN.

The first gate driving signal output circuit 13 is connected to the first pull-up node PU1, the first gate driving signal output terminal OP1, a first clock signal terminal, and the pull-down node PD, and is configured to control the connection of the first gate driving signal output terminal OP1 and the first clock signal terminal under the control of the potential of the first pull-up node PU1, control to reset a first gate driving signal outputted from the first gate driving signal output terminal OP1 under the control of the potential of the pull-down node PD, the first clock signal terminal CK1 is used to input a first clock signal.

The second gate driving signal output circuit 14 is connected to the second pull-up node PU2, the second gate driving signal output terminal OP2, a second clock signal terminal and the pull-down node PD, and is configured to control the connection of the second gate driving signal output terminal OP2 and the second clock signal terminal under the control of the potential of the second pull-up node PU2, control to reset the second gate driving signal outputted from the second gate driving signal output terminal OP2 under the control of the potential of the pull-down node PD.

The pull-down node control circuit 15 is respectively connected to a third clock signal terminal, a fourth clock signal terminal, the pull-down node PD, and the pull-up control node PUCN, and is configured to control and maintain the potential of the pull-down node PD under the control of a third clock signal inputted by the third clock signal terminal CK3 and the fourth clock signal inputted by the fourth clock signal terminal CK4, and control to reset the potential of the pull-down node PD under the control of the potential of the pull-up control node PUCN. The second clock signal terminal CK2 is used to input a second clock signal.

When the gate driving unit according to at least one embodiment of the present disclosure is operated, a frame of display time is divided into a first display period and a second display period. In a first output phase included in the first display period, the first gate driving signal output circuit 13 included in the gate driving unit outputs a valid voltage through the first gate driving signal output terminal OP1, and in a second output phase included in a second display period, the second gate driving signal output circuit 14 included in the gate driving unit outputs a valid voltage through the second gate driving signal output terminal OP2.

Optionally, a frame of display time may include a first display period and a second display period sequentially, that is, the first display period is ahead of the second display period, but not limited thereto;

Optionally, a frame of display time may include a second display period and a first display period sequentially, that is, the second display period is ahead of the first display period, but is not limited thereto.

Optionally, a valid voltage is a voltage which is inputted to a gate electrode of a transistor to turn on the transistor. For example, when the transistor is an n-type transistor, the valid voltage may be a high voltage, but not limited thereto. When the transistor is a p-type transistor, the valid voltage may be a low voltage, but is not limited thereto.

Optionally, an invalid voltage is a voltage which is inputted to a gate electrode of a transistor to turn off the transistor. For example, when the transistor is an n-type transistor, the valid voltage may be a low voltage, but not limited thereto. When the transistor is a p-type transistor, the valid voltage may be a high voltage, but is not limited thereto.

In the gate driving unit according to at least one embodiment of the present disclosure, a frame of display time is divided into two display periods, and a gate driving signal is outputted in an output phase included in one display period. In the gate driving unit according to an embodiment, gate driving signals in even lines and gate driving signal in odd lines are outputted alternately, which can reduce the refresh frequency to achieve low power consumption and reduce the risk of an increase in Flicker. In addition, the gate driving unit according to at least one embodiment of the present disclosure can provide two-stage output of the gate driving signals, which can increase the wiring space of the display panel frame.

When the gate driving unit according to at least one embodiment of the present disclosure is operated, the first display period includes a first input phase, a first output phase, a first output reset phase, and a first pull-down node control phase and a first output cut-off maintenance phase in sequence; the second display period includes a second input phase, a second output phase, a second output reset phase, a second pull-down node control phase, and a second output cut-off maintenance phase in sequence.

The gate driving method further includes following step.

In the first input phase and the second input phase, the pull-up control node control circuit 11 controls the potential of the pull-up control node PUCN to a valid voltage under the control of the start signal, and the pull-up node control circuit 12 controls the potential of the first pull-up node PU1 and the potential of the second pull-up node PU2 to be valid voltages based on the potential of the pull-up control node PUCN.

In the first output phase, the pull-up control node control circuit 11 maintains the potential of the pull-up control node PUCN as the valid voltage, the first clock signal terminal inputs a valid voltage, and the first gate driving signal output circuit 13 control the connection of the first gate driving signal output terminal OP1 and the first clock signal terminal under the control of the potential of the first pull-up node PU1, to control the first gate driving signal output terminal OP1 to output a valid voltage.

In the first output reset phase, the pull-up control node control circuit 11 maintains the potential of the pull-up control node PUCN as a valid voltage, an invalid voltage is input to the first clock signal terminal, and the first gate driving signal output circuit 13 controls the connection of the first gate driving signal output terminal OP1 and the first clock signal terminal under the control of the potential of the first pull-up node PU1, to control the first gate driving signal output terminal OP1 to output an invalid voltage.

In the first pull-down node control phase, the valid voltage is inputted to the third clock signal terminal. The pull-down node control circuit 15 controls the potential of the pull-down node PD to be a valid voltage under the control of the third clock signal inputted by CK3. The first gate driving signal output circuit 13 controls to reset the first gate driving signal outputted from the first gate driving signal output terminal under the control of the potential of the pull-down node PD.

In the first output cut-off maintenance phase, the pull-down node control circuit 15 maintains the voltage of the pull-down node PD as a valid voltage, and the first gate driving signal output circuit 13 controls to reset the first gate driving signal outputted from the first gate driving signal output terminal OP1 under the control of the potential of the pull-down node PD.

In the second output phase, the pull-up control node control circuit 11 maintains the potential of the pull-up control node PUCN as a valid voltage, the second clock signal terminal inputs a valid voltage, and the second gate driving signal output circuit 14 controls the connection of the second gate driving signal output terminal OP2 and the second clock signal terminal under the control of the potential of the two pull-up nodes PU2, to control the second gate driving signal output terminal OP2 to output a valid voltage.

In the second output reset phase, the pull-up control node control circuit 11 maintains the potential of the pull-up control node PUCN as a valid voltage, the second clock signal terminal inputs an invalid voltage, and the second gate driving signal output circuit 14 controls the connection of the second gate driving signal output terminal OP2 and the second clock signal terminal under the control of the potential of the second pull-up node PU2, to control the second gate driving signal output terminal OP2 to output an invalid voltage.

In the second pull-down node control phase, the valid voltage is inputted to the fourth clock signal terminal. The pull-down node control circuit 15 controls the voltage of the pull-down node PD to be a valid voltage under the control of the fourth clock signal inputted from CK4. The second gate driving signal output circuit 14 controls to reset the second gate driving signal outputted by the second gate driving signal output terminal OP2 under the control of the potential of the pull-down node PD.

In the second output cut-off maintenance phase, the pull-down node control circuit 15 maintains the voltage of the pull-down node PD as a valid voltage, and the second gate driving signal output circuit 14 controls to reset the second gate driving signal outputted from the second gate driving signal output terminal OP2 under the control of the potential of the pull-down node PD.

Optionally, the start terminal may include a start terminal of odd-numbered rows and a start terminal of even-numbered rows. The pull-up control node control circuit is configured to control and maintain the potential of the pull-up control node to be a valid voltage when a valid voltage is inputted by the start terminal in odd-numbered rows, and control and maintain the potential of the pull-up control node to be a valid voltage when a valid voltage is inputted by the start terminal in even-numbered rows, and control the potential of the pull-up control node to be an invalid voltage when the potential of the pull-down node is a valid voltage.

Figure 2:
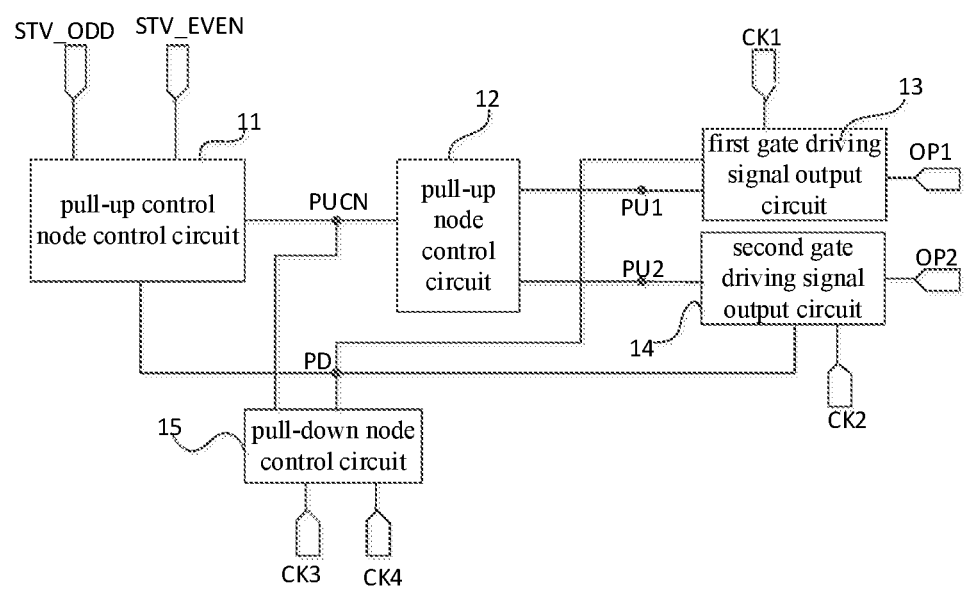
FIG. 2 is a structural diagram of a gate driving unit according to at least one embodiment of the present disclosure.

As shown in FIG. 2, on the basis of the gate driving unit according to at least one embodiment of the present disclosure shown in FIG. 1, the start terminal includes a start terminal of odd-numbered rows STV_ODD and a start terminal of even-numbered rows STV_EVEN.

The pull-up control node control circuit 11 is respectively connected to the start terminal of odd-numbered rows STV_ODD, the start terminal of even-numbered rows STV_EVEN and the pull-up control node PUCN, and is configured to control and maintain the potential of the pull-up control node PUCN as a valid voltage when a valid voltage is input to the start terminal of odd-numbered rows STV_ODD, control and maintain the potential of the pull-up control node PUCN as a valid voltage when a valid voltage is input to the start terminal of even-numbered rows STV_EVEN, and control and maintain the potential of the pull-up control node PUCN as an invalid voltage when the potential of the pull-down node PD is a valid voltage.

Specifically, the pull-up control node control circuit may include: a first transistor, the control electrode thereof being connected to the start terminal of odd-numbered rows, the first electrode thereof being connected to the first voltage terminal, and the second electrode thereof being connected to the pull-up control node; a second transistor, the control electrode thereof being connected to the start terminal of even-numbered rows, the first electrode thereof being connected to the first voltage terminal, and the second electrode thereof being connected to the pull-up control node; a pull-up control node pull-down transistor, a control electrode thereof being connected to the pull-down node, a first electrode thereof being connected to the pull-up control node, and a second electrode thereof being connected to a second voltage terminal; and a pull-up control node maintenance capacitor, a first electrode thereof being connected to the pull-up control node, and a second electrode thereof being connected to a third voltage terminal.

In specific implementation, the first voltage terminal may be a high voltage terminal, the second voltage terminal may be a low voltage terminal, and the third voltage terminal may be a low voltage terminal, but is not limited thereto.

Figure 3:
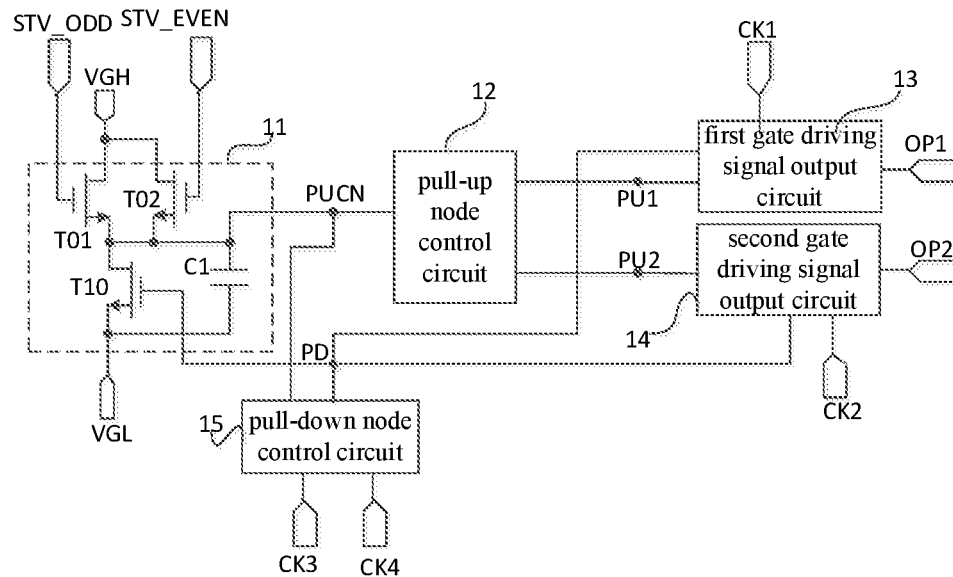
FIG. 3 is a structural diagram of a gate driving unit according to at least one embodiment of the present disclosure.

As shown in FIG. 3, based on the gate driving unit according to at least one embodiment of the present disclosure shown in FIG. 2, the pull-up control node control circuit 11 includes: a first transistor T01, a gate electrode thereof being connected to the start terminal of odd-numbered rows STV_ODD, a drain electrode thereof being connected to a high voltage terminal, and a source electrode thereof being connected to the pull-up control node PUCN, the high voltage terminal being used to input a high voltage VGH; a second transistor T02, a gate electrode thereof being connected to the start terminal of even-numbered rows STV_EVEN, a drain electrode thereof being connected to the high voltage terminal, and a source electrode thereof being connected to the pull-up control node PUCN; a pull-up control node pull-down transistor T10, a gate electrode thereof being connected to the pull-down node PD, a drain electrode thereof being connected to the pull-up control node PUCN, and a source electrode thereof being connected to a low voltage terminal; and a pull-up control node maintenance capacitor C1, a first electrode thereof being connected to the pull-up control node PUCN, and a second electrode thereof being connected to the low-voltage terminal, the low voltage terminal is used to input a low voltage VGL.

In at least one embodiment of the present disclosure shown in FIG. 3, each transistor is an n-type thin film transistor, but is not limited thereto.

Figure 4:
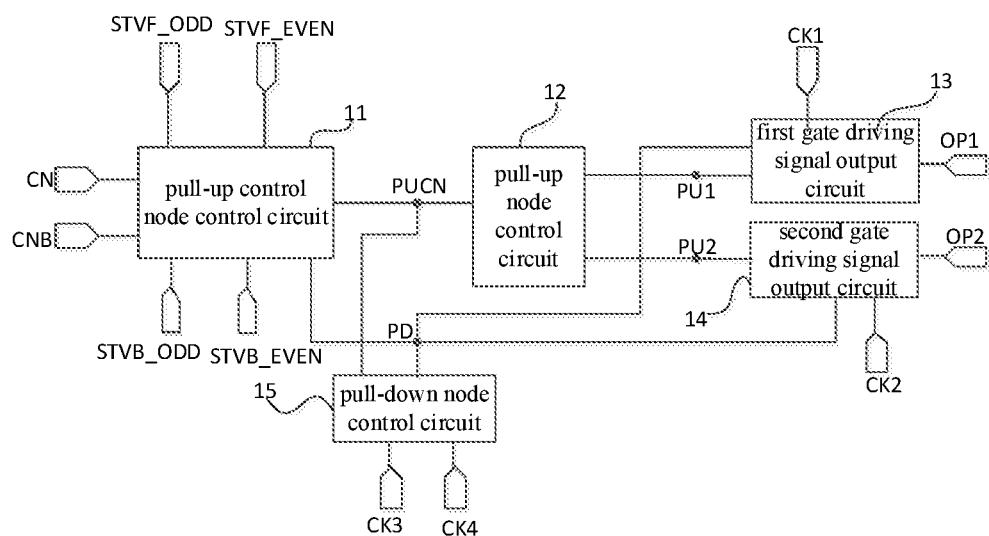
FIG. 4 is a structural diagram of a gate driving unit according to at least one embodiment of the present disclosure.

As shown in FIG. 4, on the basis of the gate driving unit according to at least one embodiment of the present disclosure shown in FIG. 1, the start terminal includes a forward start terminal of odd-numbered rows STVF_ODD and a reverse start terminal of odd-numbered rows STVB_ODD, a forward start terminal of even-numbered rows STVF_EVEN and a reverse start terminal of even-numbered rows STVB_EVEN; the gate driving unit may further include a forward scan control terminal CN and a reverse scan control terminal CNB.

The pull-up control node control circuit 11 is respectively connected to the forward scan control terminal CN, the forward start terminal of odd-numbered rows SVTF_ODD, the pull-up control node PUCN, and the forward start terminal of even-numbered rows STVF_EVEN, and is configured to, during the forward scanning, under the control of the forward scanning control signal inputted by the forward scanning control terminal CN, when the valid voltage is inputted to the forward start terminal of the odd-numbered rows STVF_ODD, control the potential of the pull-up control node PUCN to be a valid voltage, and when a valid voltage is inputted by the forward start terminal of even-numbered rows STVF_EVEN, control and maintain the potential of the pull-up control node PUCN as a valid voltage.

The pull-up control node control circuit 11 is also connected to a reverse scan control terminal CNB, a reverse start terminal of odd-numbered rows STVB_ODD, and a reverse start terminal of even-numbered rows STVB_EVEN, and is configured to, during the reverse scanning, under the control of the reverse scanning control signal inputted by the control terminal CNB, when the valid voltage is inputted by the reverse start terminal of odd-numbered rows STVB_ODD, control the potential of the pull-up control node PUCN to be a valid voltage, and when the valid voltage is inputted by the reverse start terminal of even-numbered rows STVB_EVEN, control and maintain the potential of the pull-up control node PUCN as a valid voltage.

The pull-up control node control circuit 11 is further connected to the pull-down node PD, and is further configured to control the potential of the pull-up control node PUCN to an invalid voltage when the potential of the pull-down node PD is a valid voltage.

Optionally, the pull-up control node control circuit may include: a first forward scanning control transistor, a control electrode thereof being connected to the forward scanning control terminal, and a first electrode thereof being connected to the forward start terminal of odd-numbered rows; a second forward scan control transistor, a control electrode thereof being connected to the forward scan control terminal, and a first electrode thereof being connected to the forward start terminal of even-numbered rows; a first reverse scan control transistor, a control electrode thereof being connected to the reverse scan control terminal, a first electrode thereof being connected to a control electrode of a first pull-up control node control transistor, and a second electrode thereof being connected to the reverse start terminal of odd-numbered rows; a second reverse scan control transistor, a control electrode thereof being connected to the reverse scan control terminal, a first electrode thereof being connected to a control electrode of a second pull-up control node control transistor, and a second electrode thereof being connected to the reverse start terminal of even-numbered rows; a first pull-up control node control transistor, a control electrode thereof being connected to a second electrode of the first forward scan control transistor, a first electrode thereof being connected to the first voltage terminal, and a second electrode thereof being connected to the pull-up control node; a second pull-up control node control transistor, a control electrode thereof being connected to the second electrode of the second forward scan control transistor, the first electrode thereof being connected to the first voltage terminal, and the second electrode thereof being connected to the pull-up control node; a pull-up control node pull-down transistor, a control electrode thereof being connected to the pull-down node, a first electrode thereof being connected to the pull-up control node, and a second electrode thereof being connected to a second voltage terminal; and a pull-up control node maintenance capacitor, a first electrode thereof being connected to the pull-up control node, and a second electrode thereof being connected to a third voltage terminal.

Figure 5:
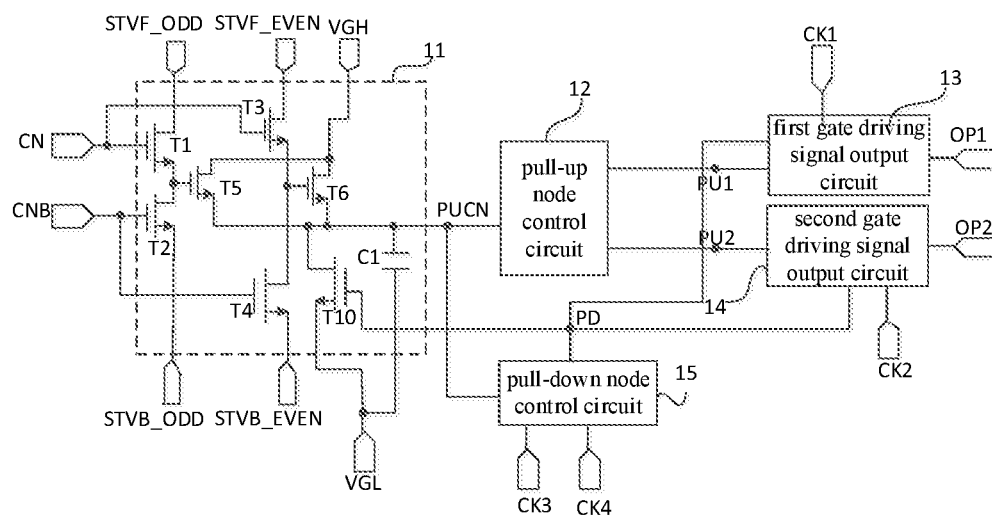
FIG. 5 is a structural diagram of a gate driving unit according to at least one embodiment of the present disclosure.

As shown in FIG. 5, based on the gate driving unit according to at least one embodiment of the present disclosure shown in FIG. 4, the pull-up control node control circuit 11 includes: a first forward scan control transistor T1, a gate electrode thereof being connected to the forward scan control terminal CN and a drain electrode thereof being connected to the forward start terminal of odd-numbered rows STVF_ODD; a second forward scan control transistor T3, a gate thereof being connected to the forward scan control terminal CN, and a drain electrode thereof being connected to the forward start terminal of even-numbered rows STVF_EVEN; a first reverse scan control transistor T2, a gate electrode thereof being connected to the reverse scan control terminal CNB, a drain electrode thereof being connected to the gate electrode of the first pull-up control node control transistor T5, and a source electrode thereof being connected to the reverse start terminal of odd-numbered rows STVB_ODD; a second reverse scan control transistor T4, a gate electrode thereof being connected to the reverse scan control terminal CNB, a drain electrode thereof being connected to the gate electrode of the second pull-up control node control transistor T6, and a source electrode thereof being connected to the reverse start terminal of even-numbered rows STVB_EVEN; a first pull-up control node control transistor T5, a gate electrode thereof being connected to a source electrode of the first forward scan control transistor T3, a drain electrode thereof being connected to a high voltage terminal, and a source electrode thereof being connected to the pull-up control node PUCN, the high voltage terminal being used to input high voltage VGH; a second pull-up control node control transistor T6, a gate electrode thereof being connected to a source electrode of the second forward scan control transistor T3, a drain electrode thereof being connected to the high voltage terminal, and a source electrode thereof being connected to the pull-up control node PUCN; a pull-up control node pull-down transistor T10, a gate electrode thereof being connected to the pull-down node PD, a drain electrode thereof being connected to the pull-up control node PUCN, and a second electrode thereof being connected to a low voltage terminal; and a pull-up control node maintenance capacitor C2, a first electrode thereof being connected to the pull-up control node PUCN, and the second electrode thereof being connected to the low-voltage terminal. The low-voltage terminal is used to input a low voltage VGL.

Figure 6:
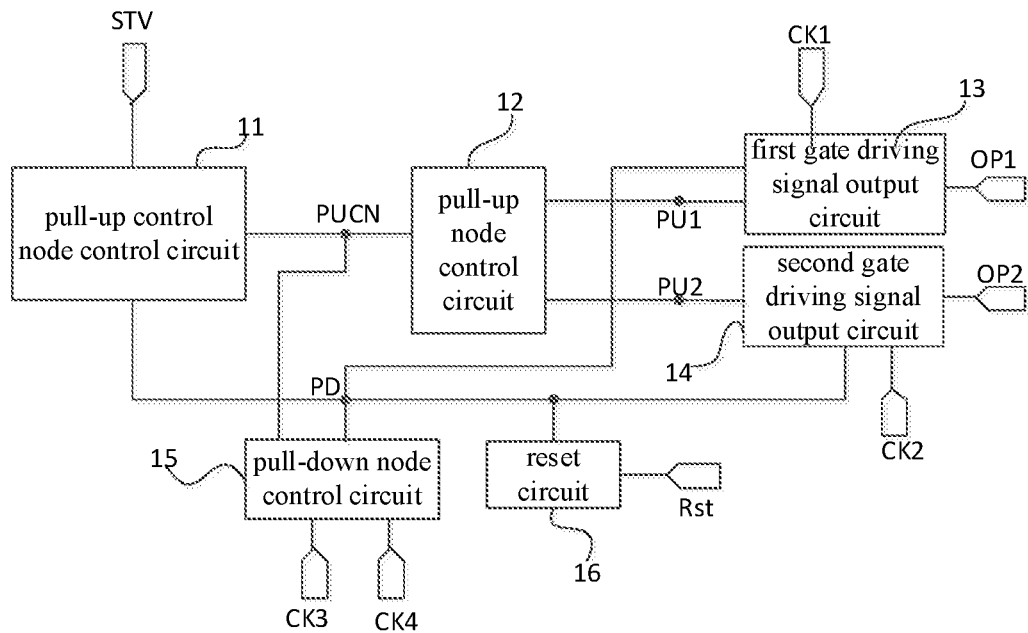
FIG. 6 is a structural diagram of a gate driving unit according to at least one embodiment of the present disclosure.

In specific implementation, as shown in FIG. 6, based on the gate driving unit according to at least one embodiment of the present disclosure shown in FIG. 1, the gate driving unit according to at least one embodiment of the present disclosure further includes a reset circuit 16.

The reset circuit 16 is respectively connected to a blank area reset terminal Rst and a pull-down node PD, and is configured to control the potential of the pull-down node PD to be a valid voltage under the control of a blank area reset signal inputted by the blank area reset terminal Rst.

In the blank phase, Rst inputs a valid voltage, and the reset circuit 16 controls the potential of the PD to be a valid voltage under the control of a blank area reset signal inputted by Rst, so as to control the potential of PUCN, the first gate driving signal outputted by OP1 and the second gate driving signal outputted by OP2 for noise reduction.

Optionally, the pull-up node control circuit may include: a first pull-up node control transistor, a control electrode thereof being connected to a first voltage terminal, a first electrode thereof being connected to the first pull-up node, and a second electrode thereof being connected to the pull-up control node; and a second pull-up node control transistor, a control electrode thereof being connected to the first voltage terminal, a first electrode thereof being connected to the second pull-up node, and a second electrode thereof being connected to the pull-up control node.

Specifically, the pull-down node control circuit may include: a first pull-down node control transistor, and both the control electrode and the first electrode thereof being connected to the third clock signal terminal, and the second electrode thereof being connected to the pull-down node; a second pull-down node control transistor, and both the control electrode and the second electrode thereof being connected to the fourth clock signal terminal, and the first electrode thereof being connected to the pull-down node; a third pull-down node control transistor, a control electrode thereof being connected to the pull-up control node, a first electrode thereof being connected to the pull-down node, and a second electrode thereof being connected to a second voltage terminal; and a pull-down node maintenance capacitor, a first electrode thereof being connected to the pull-down node, and a second electrode thereof being connected to a fourth voltage terminal.

Optionally, the fourth voltage terminal may be a low voltage terminal, but is not limited thereto.

Optionally, the first gate driving signal output circuit may include a first output transistor and a first output pull-down transistor; a control electrode of the first output transistor is connected to the first pull-up node, a first electrode of the first output transistor is connected to the first clock signal terminal, and a second electrode of the first output transistor is connected to the first gate driving signal output terminal. A control electrode of the first output pull-down transistor is connected to the pull-down node, a first electrode of the first output pull-down transistor is connected to the first gate driving signal output terminal, and a second electrode of the first output pull-down transistor is connected to the second voltage terminal.

Optionally, the second gate driving signal output circuit may include a second output transistor and a second output pull-down transistor. A control electrode of the second output transistor is connected to the second pull-up node, the first electrode of the second output transistor is connected to the second clock signal terminal, and the second electrode of the second output transistor is connected to the second gate driving signal output terminal. A control electrode of the second output pull-down transistor is connected to the pull-down node, a first electrode of the second output pull-down transistor is connected to the second gate driving signal output terminal, and a second electrode of the second output pull-down transistor is connected to the second voltage terminal.

Figure 7:
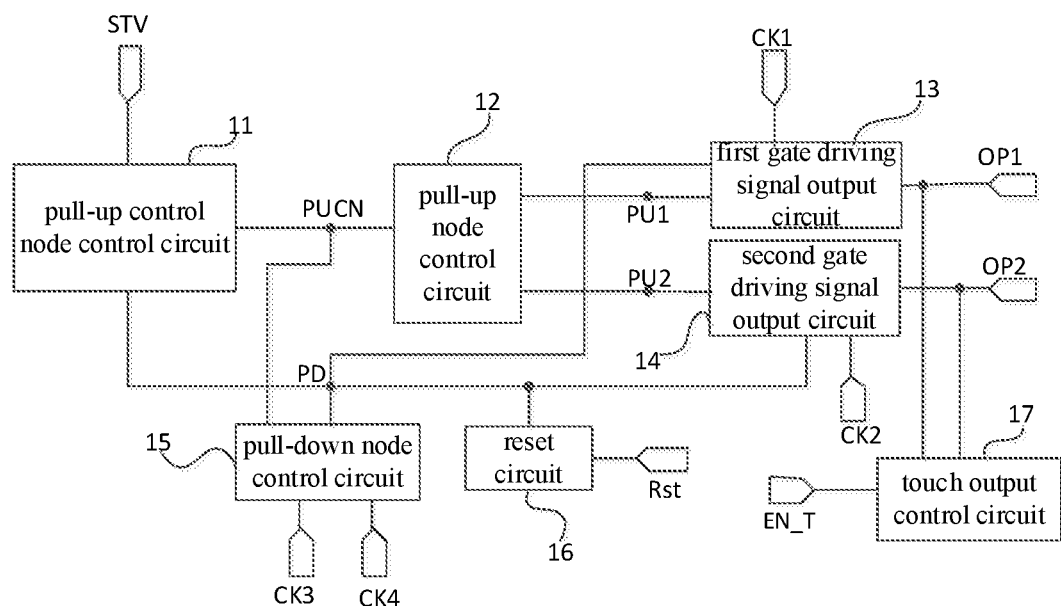
FIG. 7 is a structural diagram of a gate driving unit according to at least one embodiment of the present disclosure.

As shown in FIG. 7, based on the gate driving unit according to at least one embodiment of the present disclosure shown in FIG. 6, the gate driving unit according to at least one embodiment of the present disclosure may further include a touch output control circuit 17. The touch output control circuit 17 is connected to the touch output control terminal EN_T, the first gate driving signal output terminal OP1, and the second gate driving signal output terminal OP2, respectively, and is configured to control both the first gate driving signal output terminal OP1 and the second gate driving signal output terminal OP2 to output an invalid voltage under the control of a touch output control signal inputted by the touch output control terminal EN_T.

In specific implementation, the gate driving unit according to at least one embodiment of the present disclosure may further include a touch output control circuit 17 that, during a touch phase, controls both OP1 and OP2 to output an invalid voltage under the control of a touch output control signal inputted by the touch output control terminal EN_T, to avoid fault display caused by enabling the gate lines on the display panel during the touch phase.

Figure 8:
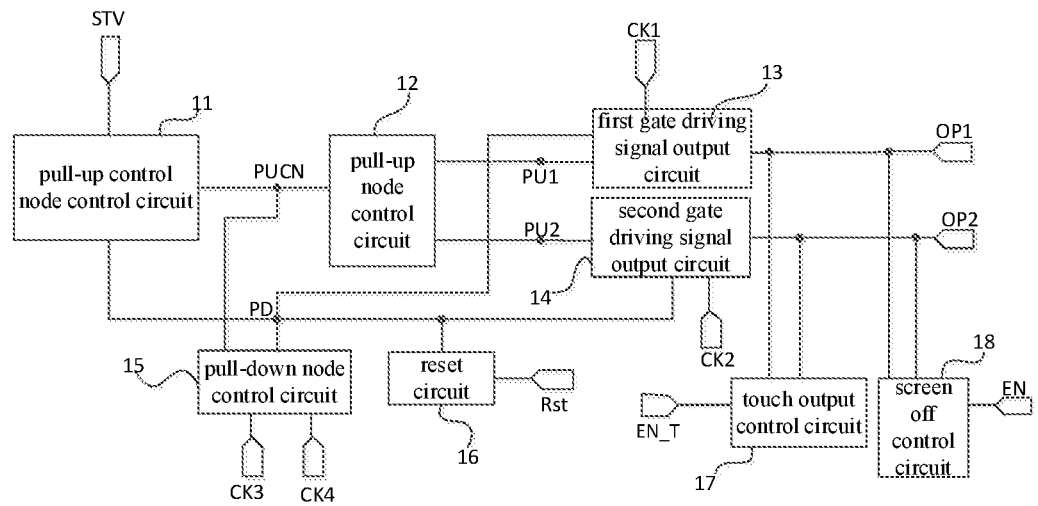
FIG. 8 is a structural diagram of a gate driving unit according to at least one embodiment of the present disclosure.

As shown in FIG. 8, based on the gate driving unit according to at least one embodiment of the present disclosure shown in FIG. 7, the gate driving unit according to at least one embodiment of the present disclosure may further include a screen off control circuit 18. The screen off control circuit 18 is configured to control both the first gate driving signal output terminal OP1 and the second gate driving signal output terminal OP2 to output a valid voltage under the control of a screen off control signal inputted by the screen off control terminal EN.

Optionally, the gate driving unit according to at least one embodiment of the present disclosure may further include a screen off control circuit 18, and when the screen is off, the screen off control circuit 18 controls both OP1 and OP2 to output a valid voltage under the control of the screen off control signal, so as to release the residual charge.

Figure 9:
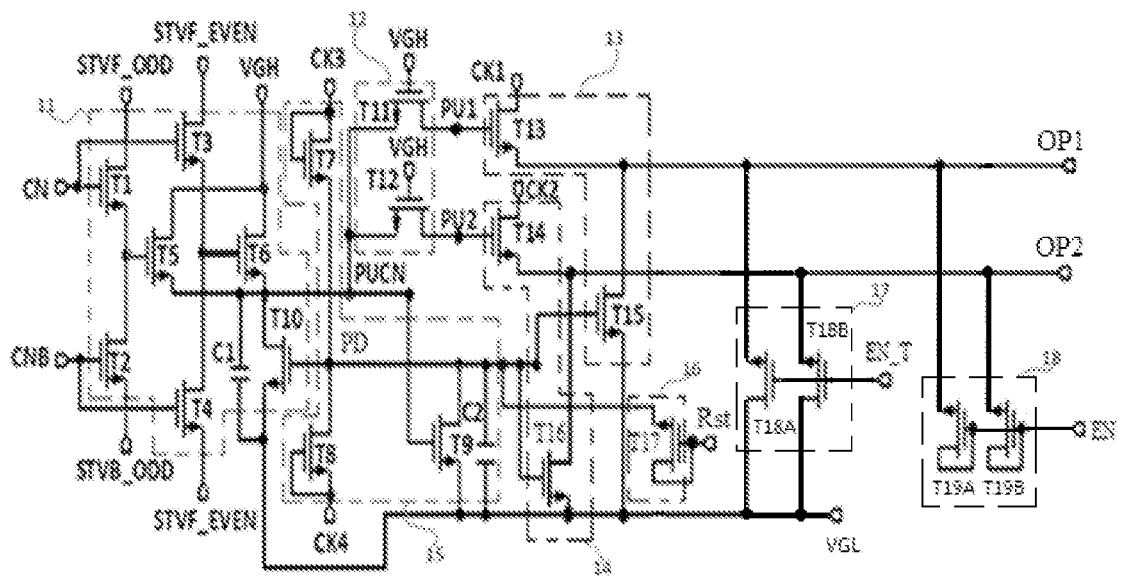
FIG. 9 is a circuit diagram of a gate driving unit according to at least one embodiment of the present disclosure.

As shown in FIG. 9, the gate driving unit according to at least one of the present disclosure includes a start terminal, a first gate driving signal output terminal OP1, a second gate driving signal output terminal OP2, a pull-up control node control circuit 11, a pull-up node control circuit 12, the first gate driving signal output circuit 13, the second gate driving signal output circuit 14, the pull-down node control circuit 15, the reset circuit 16, the touch output control circuit 17, and the screen off control circuit 18.

The start terminal includes a forward start terminal of odd-numbered rows STVF_ODD, a reverse start terminal of odd-numbered rows STVB_ODD, a forward start terminal of even-numbered rows STVF_EVEN, and a reverse start terminal of odd-numbered rows STVB_EVEN. The gate driving unit further includes a forward scan control terminal CN and reverse scan control terminal CNB.

The pull-up control node control circuit 11 includes: a first forward scan control transistor T1, a gate electrode thereof being connected to the forward scan control terminal CN and a drain electrode thereof being connected to the forward start terminal of odd-numbered rows SVTF_ODD; a second forward scan control transistor T3, a gate electrode thereof being connected to the forward scan control terminal CN, and a drain electrode thereof being connected to the forward start terminal of even-numbered rows STVF_EVEN; a first reverse scan control transistor T2, a gate electrode thereof being connected to the reverse scan control terminal CNB, a drain electrode thereof being connected to the gate electrode of the first pull-up control node control transistor T5, and a source electrode thereof being connected to the reverse start terminal of odd-numbered rows STVB_ODD; a second reverse scan control transistor T4, a gate electrode thereof being connected to the reverse scan control terminal CNB, a drain electrode thereof being connected to the gate electrode of the second pull-up control node control transistor T6, and a source electrode thereof being connected to the reverse start terminal of even-numbered rows STVB_EVEN; a first pull-up control node control transistor T5, a gate electrode thereof being connected to a source electrode of the first forward scan control transistor T3, a drain electrode thereof being connected to a high voltage terminal, and a source electrode thereof being connected to the pull-up control node PUCN; a high voltage terminal is used to input the high voltage VGH; a second pull-up control node control transistor T6, a gate electrode thereof being connected to a source electrode of the second forward scan control transistor T3, a drain electrode thereof being connected to the high voltage terminal, and a source electrode thereof being connected to the pull-up control node PUCN; a pull-up control node pull-down transistor T10, a gate electrode thereof being connected to the pull-down node PD, a drain electrode thereof being connected to the pull-up control node PUCN, and a source electrode thereof being connected to a low voltage terminal; and a pull-up control node maintenance capacitor C1, a first electrode thereof being connected to the pull-up control node PUCN, and a second electrode thereof being connected to a low voltage terminal; the low voltage terminal is used to input the low voltage VGL.

The pull-up node control circuit 12 includes: a first pull-up node control transistor T11, a gate electrode thereof being connected to the high voltage terminal, a drain electrode thereof being connected to the first pull-up node PU1, and a source electrode thereof being connected to the pull-up control node PUCN; and a second pull-up node control transistor T12, a gate electrode thereof being connected to the high voltage terminal, a drain electrode thereof being connected to the second pull-up node PU2, and a source electrode thereof being connected to the pull-up control node PUCN; the high voltage terminal is used to input the high voltage VGH.

The pull-down node control circuit 15 includes: a first pull-down node control transistor T7, a gate electrode and a drain electrode thereof being both connected to the third clock signal terminal, and a source electrode thereof being connected to the pull-down node PD; a third clock signal terminal CK3 is used to input a third clock signal; a second pull-down node control transistor T8, a gate electrode and a source electrode thereof being connected to the fourth clock signal terminal, and a drain electrode thereof being connected to the pull-down node PD; the fourth clock signal terminal CK4 is used to input a fourth clock signal; a third pull-down node control transistor T9, a gate electrode thereof being connected to the pull-up control node PUCN, a drain electrode thereof being connected to the pull-down node PD, and a source electrode thereof being connected to the low voltage terminal; and a pull-down node maintenance capacitor C2, a first electrode thereof being connected to the pull-down node PD, and a second electrode thereof being connected to the low-voltage terminal.

The first gate driving signal output circuit 13 includes a first output transistor T13 and a first output pull-down transistor T15. The gate electrode of the first output transistor T13 is connected to the first pull-up node PU1, the drain electrode of the first output transistor T13 is connected to the first clock signal terminal, and the source electrode of the first output transistor T13 is connected to the first gate driving signal output terminal OP1; the first clock signal terminal CK1 is used to input a first clock signal. The gate electrode of the first output pull-down transistor T15 is connected to the pull-down node PD, the drain electrode of the first output pull-down transistor T15 is connected to the first gate driving signal output terminal OP1, and a source electrode of the first output pull-down transistor T15 is connected to the low voltage terminal.

The second gate driving signal output circuit 14 includes a second output transistor T14 and a second output pull-down transistor T16. The gate electrode of the second output transistor T14 is connected to the second pull-up node PU2, the drain electrode of the second output transistor T14 is connected to the second clock signal terminal, and the source electrode of the second output transistor T14 is connected to the second gate driving signal output terminal OP2; the second clock signal terminal CK2 is used to input a second clock signal. A gate electrode of the second output pull-down transistor T16 is connected to the pull-down node PD, a drain electrode of the second output pull-down transistor T16 is connected to the second gate driving signal output terminal OP2, and the source electrode of the second output pull-down transistor T16 is connected to the low voltage terminal.

The reset circuit 16 includes a reset transistor T17. The gate electrode of the reset transistor T17 is connected to a blank area reset terminal Rst, the source electrode of the reset transistor T17 is connected to the pull-down node PD, and the drain electrode of the reset transistor T17 is connected to a low voltage terminal.

The touch output control circuit 17 includes a first touch output control transistor T18A and a second touch output control transistor T18B. The gate electrode of the first touch output control transistor T18A is connected to the touch output control terminal EN_T, and the source electrode of the first touch output control transistor T18A is connected to the first gate driving signal output terminal OP1. The drain electrode of the first touch output control transistor T18A is connected to a low voltage terminal. The gate electrode of the second touch output control transistor T18B is connected to the touch output control terminal EN_T, and the source electrode of the second touch output control transistor T18B is connected to the second gate driving signal output terminal OP2, the drain electrode of the second touch output control transistor T18B is connected to the low voltage terminal.

The screen off control circuit 18 includes a first screen off control transistor T19A and a second screen off control transistor T19B. The gate electrode of the first screen off control transistor T19A and the source electrode of the first screen off control transistor T19A are both connected to the screen off control terminal EN. The drain electrode of the first screen off control transistor T19A is connected to the first gate driving signal output terminal OP1. The gate electrode of the second screen off control transistor T19B and the source electrode of the second screen off control transistor T19B are both connected to the screen off control terminal EN, and the drain electrode of the second screen off control transistor T19B is connected to the second gate driving signal output terminal OP2.

In at least one embodiment of the present disclosure shown in FIG. 9, all transistors are n-type thin film transistors, but not limited thereto. When the specific embodiment of the gate driving unit shown in FIG. 9 is in operation, the valid voltage may be a high voltage and the invalid voltage may be a low voltage, but not limited thereto.

In at least one embodiment of the present disclosure shown in FIG. 9, the first voltage terminal is a high voltage terminal, and the second voltage terminal, the third voltage terminal, and the fourth voltage terminal are all low voltage terminal, but not limited to this.

When at least one embodiment of the present disclosure shown in FIG. 9 is in operation, in touch phase, EN_T outputs a high level, both T18A and T18B are turned on to control both OP1 and OP2 to output a low level, so that all pixel units on the display panel do not work;

When the screen is power off in an abnormal condition, the EN inputs a high level so that both OP1 and OP2 output a high level to enable all the gate lines, so as to release the residual charge in the pixel unit.

Figure 10:
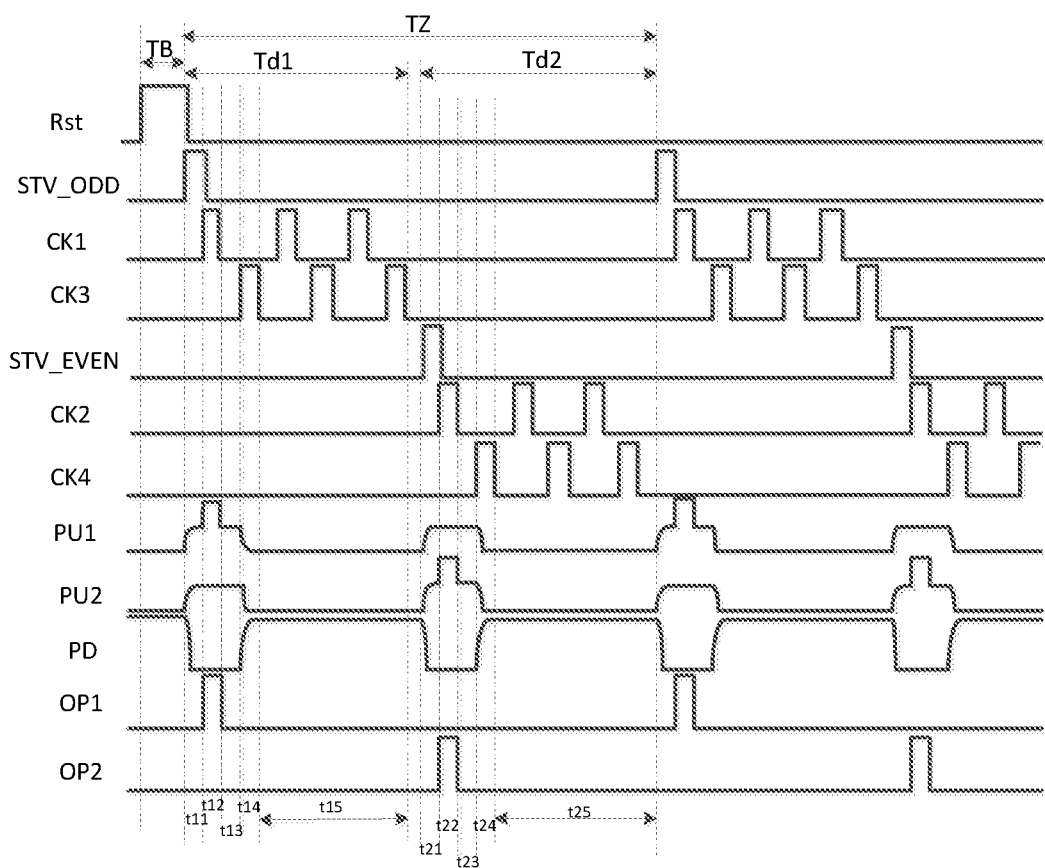
FIG. 10 is a time sequence diagram showing the operation of the gate driving unit shown in FIG. 9 according to at least one embodiment of the present disclosure.

At least one embodiment of the present disclosure as shown in FIG. 9 is in operation, during forward scanning, CN inputs a high level, CNB inputs a low level, STVB_ODD and STVB_EVEN both input a low level, and the difference between a conventional gate driving unit and a gate driving unit of at least one embodiment of the present disclosure is shown in FIG. 10, in at least one embodiment of the present disclosure, a frame of display time TZ is divided into a first display period Td1 and a second display period Td2, and in a first output phase in the first display period Td1, OP1 outputs a high voltage, and in a second output phase in the second display period Td2, OP2 outputs a high voltage.

The first display period Td1 includes a first input phase t11, a first output phase t12, a first output reset phase t13, a first pull-down node control phase t14, and a first output cut-off maintenance phase t15 in sequence. The second display period Td2 includes a second input phase t21, a second output phase t22, a second output reset phase t23, a second pull-down node control phase t24, and a second output cut-off maintenance phase t25 in sequence. A blank phase TB is set before the first display period Td1.

In the blank phase TB, Rst inputs a high level, T17 is turned on to pull up the potential of PD to a high level.

In the first display period Td1, the following process is implemented.

In the first input phase t11, STVF_ODD inputs a high level, STV_EVEN inputs a low level, T1 is turned on, the gate electrode of T5 is connected to a high level, T5 is turned on to pull up the potential of PUCN to VGH; T11 and T12 are turned on, the potential of PU1 and the potential of PU2 both become a high level, T13 and T14 are both turned on, CK1 inputs a low level, CK2 inputs a low level, OP1 outputs a low level, OP2 outputs a low level; T9 is turned on to pull down the potential of PD to a low level VGL; C1 maintains the potential of PUCN to be a high level.

In the first output phase t12, STVF_ODD inputs a low level, STV_EVEN inputs a low level, CK1 inputs a high level, the potential of PU1 increases further due to the bootstrap, T13 turns on, OP1 outputs a high level, and the potential of PUCN and the potential of PU2 are maintained at a high level at time t11, T9 is turned on, and the potential of PD is maintained at VGL; and CK2 inputs a low level, and OP2 outputs a low level.

In the first output reset phase t13, CK1 inputs a low level, the potential of PU1 recover to the high level at time t11 due to the bootstrap, T13 is still turned on, and OP1 outputs a low level; and CK2 inputs a low level, and OP2 outputs a low level In the first pull-down node control period t14, CK3 inputs a high level, T7 is turned on to pull up the potential of PD to a high level, and T10, T15, and T16 are turned on to pull down the potential of PUCN to VGL, and OP1 and OP2 both output a low level.

In the first output cut-off maintenance phase t15, CK3 input a low level and a high level at intervals. When CK3 inputs a high level, T7 is turned on to maintain the potential of PD to be a high level and the potential of PUCN to be VGL. OP1 and OP2 both output a low level.

In the second display period Td2, the following process is implemented.

In the second input phase t21, STVF_ODD inputs a low level, STV_EVEN inputs a high level, T3 is turned on, the gate electrode of T6 is connected to a high level, and T6 is turned on to pull up the potential of PUCN to VGH; T11 and T12 are turned on, the potential of PU1 and the potential of PU2 both become a high level, T13 and T14 are both turned on, CK1 inputs a low level, CK2 inputs a low level, OP1 outputs a low level, OP2 outputs a low level; T9 is turned on to pull down the potential of PD to VGL; the potential of PUCN is maintained to a high level by C1.

In the second output phase t22, STVF_ODD inputs a low level, STV_EVEN inputs a low level, CK2 inputs a high level, the potential of PU2 increase further due to the bootstrap, T14 is turned on, OP2 outputs a high level, and the potential of PUCN and the potential of PU1 are maintained at a high level at time t11, T9 is turned on, and the potential of PD is maintained at VGL; and CK1 inputs a low level, and OP1 outputs a low level.

In the second output reset phase t23, CK2 inputs a low level, the potential of PU2 recovers to the high level at time t21 due to the bootstrap, T14 is still turned on, and OP2 outputs a low level; and CK1 inputs a low level, and OP1 outputs a low level.

In the second pull-down node control phase t24, CK4 inputs a high level, T8 is turned on to pull up the potential of PD, T10, T15, and T16 are turned on to pull down the potential of PUCN to VGL, and both OP1 and OP2 output a low level.

In the second output cut-off maintenance phase t25, CK4 inputs a low level and a high level in intervals. When CK4 inputs a high level, T8 is turned on to maintain the potential of PD to be a high level and the potential of PUCN to be VGL. Both OP1 and OP2 output a low level.

The gate driving method according to at least one embodiment of the present disclosure is used to drive the above gate driving unit. A frame of display time includes a first display period and a second display period, and the first display period includes a first input phase and a first output phase in sequence; the second display period includes a second input phase and a second output phase in sequence; and the gate driving method includes the following steps.

In the first input phase and the second input phase, the pull-up control node control circuit controls the potential of the pull-up control node to be a valid voltage under the control of the start signal, and the pull-up node control circuit controls the potential of the first pull-up node and the potential of the second pull-up node to be valid voltages based on the potential of the pull-up control node.

In the first output phase, the pull-up control node control circuit maintains the potential of the pull-up control node as a valid voltage, the valid voltage is inputted to the first clock signal terminal, and the first gate driving signal output circuit controls the connection of the first gate driving signal output terminal and the first clock signal terminal under the potential of the first pull-up node, to control the first gate driving signal output terminal to output a valid voltage.

In the second output phase, the pull-up control node control circuit maintains the potential of the pull-up control node as a valid voltage, the second clock signal terminal inputs a valid voltage, and the second gate driving signal output circuit controls the connection of the second gate driving signal output terminal and the second clock signal terminal under the control of the potential of the second pull-up node, to control the second gate driving signal output terminal to output a valid voltage.

In the gate driving method according to at least one embodiment of the present disclosure, a frame of display time is divided into a first display period and a second display period. In a first output phase included in the first display period, a first gate driving signal output circuit included in the gate driving unit controls the first gate driving signal output terminal to output a valid signal, and in a second output phase included in a second display period, the gate driving signal output circuit outputs a valid voltage through the second gate driving signal output terminal.

In the gate driving method according to at least one embodiment of the present disclosure, a frame of display time is divided into two display periods, and in an output phase included in one display period, a gate driving signal is outputted. In the gate driving method according to an embodiment, a gate driving signal of odd-numbered rows and a gate driving signal of even-numbered rows are outputted alternately, which can reduce the refresh frequency. However, the pulse width of the clock signal is consistent with that of the high refresh frequency, which can reduce the risk of Flicker while achieving low power consumption. In addition, in the gate driving method according to at least one embodiment of the present disclosure, two-level gate driving signal output may be provided and the wiring space of the display panel frame is increased.

Optionally, the first display period may further include a first output reset phase and a first pull-down node control phase set after the first output phase, and the second display period may further include the second output reset phase and the second pull-down node control phase set after the second output phase, the gate driving method may further include the following steps.

In the first output reset phase, the pull-up control node control circuit maintains the potential of the pull-up control node as a valid voltage, an invalid voltage is inputted by the first clock signal terminal, and the first gate driving signal output circuit controls the connection of the first gate driving signal output terminal and the first clock signal terminal under the control of the potential of the first pull-up node, to control the first gate driving signal output terminal to output an invalid voltage.

In the first pull-down node control phase, a valid voltage is inputted by the third clock signal terminal. The pull-down node control circuit controls the voltage of the pull-down node to be a valid voltage under the control of the third clock signal. The first gate driving signal output circuit controls to reset the first gate driving signal outputted from the first gate driving signal output terminal under the control of the potential of the pull-down node.

In the second output reset phase, the pull-up control node control circuit maintains the potential of the pull-up control node as a valid voltage, an invalid voltage is inputted by the second clock signal terminal, and a second gate driving signal output circuit control the connection of the second gate driving signal output terminal and the second clock signal terminal under the control of the potential of the second pull-up node, to control the second gate driving signal output terminal to output an invalid voltage.

In the second pull-down node control phase, the valid voltage is inputted by the fourth clock signal terminal. The pull-down node control circuit controls the voltage of the pull-down node to be a valid voltage under the control of the fourth clock signal. The second gate driving signal output circuit controls to reset the second gate driving signal outputted from the second gate driving signal output terminal under the control of the potential of the pull-down node.

Optionally, in the first output reset phase, the pull-up control node control circuit maintains the potential of the pull-up control node as a valid voltage, and the first gate driving signal output circuit controls the first gate driving signal output terminal to output an invalid voltage. In the first pull-down node control phase, the pull-down node control circuit controls the voltage of the pull-down node to be a valid voltage, and the first gate driving signal output circuit controls to reset the first gate driving signal outputted from the first gate driving signal output terminal; in the second output reset phase, the pull-up control node control circuit maintains the potential of the pull-up control node as a valid voltage, and the second gate driving signal output circuit controls the second gate driving signal output terminal to output the invalid voltage; in the second pull-down node control phase, the pull-down node control circuit controls the voltage of the pull-down node to be a valid voltage, and the second gate driving signal output circuit controls to reset the second gate driving signal outputted from the second gate driving signal output terminal.

Optionally, the first display period further includes a first output cutoff maintenance phase set after the first pull-down node control phase, and the second display period further includes a second output cut-off maintenance phase set after the second pull-down node control phase. The gate driving method further includes the following steps.

In the first output cut-off maintenance phase, the pull-down node control circuit maintains the voltage of the pull-down node as a valid voltage, and the first gate driving signal output circuit controls to reset the first gate driving signal outputted from the first gate driving signal output terminal under the control of the potential of the pull-down node.

In the second output cut-off maintenance phase, the pull-down node control circuit maintains the voltage of the pull-down node as a valid voltage, and the second gate driving signal output circuit controls to reset the second gate driving signal outputted from the second gate driving signal output terminal under the control of the potential of the pull-down node.

In specific implementation, in an output cut-off maintenance phase, the pull-down node control circuit maintains the voltage of the pull-down node as a valid voltage, and the first gate driving signal output circuit controls to reset the first gate driving signal; in the second output cut-off maintenance phase, the pull-down node control circuit maintains the voltage of the pull-down node as a valid voltage, and the second gate driving signal output circuit resets the second gate driving signal.

Optionally, the gate driving method according to at least one embodiment of the present disclosure may further include the following steps.

In the first input phase and the second input phase, an invalid voltage is inputted by the first clock signal terminal and the second clock signal terminal, and the first gate driving signal output circuit controls the connection of the first gate driving signal output terminal and the first clock signal terminal under the control of the potential of the first pull-up node, to control the first gate driving signal output terminal to output an invalid voltage, and the second gate driving signal output circuit controls the connection of the second gate driving signal output terminal and the second clock signal terminal under the control of the potential of the second pull-up node, to control the second gate driving signal output terminal to output an invalid voltage.

In the first output phase, a valid voltage is inputted by the second clock signal terminal, and the second gate driving signal output circuit controls the connection of the second gate driving signal output terminal and the second clock signal terminal under the control of the potential of the second pull-up node, to control the second gate driving signal output terminal to output an invalid voltage.

In the second output phase, a valid voltage is inputted by the first clock signal terminal, and the first gate driving signal output circuit controls the connection of the first gate driving signal output terminal and the first clock signal terminal under the control of the potential of the first pull-up node, to control the first gate driving signal output terminal to output an invalid voltage.

Optionally, in the first input phase and the second input phase, the first gate driving signal output circuit controls the first gate driving signal output terminal to output an invalid voltage, and the second gate driving signal output circuit controls the second gate driving signal output terminal to output an invalid voltage; in the first output phase, the second gate driving signal output circuit controls the second gate driving signal output terminal to output the invalid voltage; in the second output phase, the first gate driving signal output circuit controls the first gate driving signal output terminal to output an invalid voltage.

Optionally, the gate driving unit may further include a reset circuit, and the gate driving method according to at least one embodiment of the present disclosure further includes: setting a blank phase between the two display periods, the reset circuit controls the potential of the pull-down node to be a valid voltage under the control of a blank area reset signal inputted by the blank area reset terminal.

In specific implementation, in the blank phase, the reset circuit controls the potential of the pull-down node to be a valid voltage under the control of the blank area reset signal inputted by the blank area reset terminal to drive the first gate driving signal and the second gate driving signal to implement noise reduction.

The gate driving circuit according to at least one embodiment of the present disclosure includes a plurality of stages of the above-mentioned gate driving units.

Optionally, the start terminal may include a start terminal of even-numbered rows and a start terminal of even-numbered rows. Except for the first-stage of gate driving unit, the start terminal of odd-numbered rows of a current stage of the gate driving unit is connected to the first gate driving signal output terminal of an adjacent previous-stage of gate driving unit. The start terminal of the even-numbered rows of a current stage of gate driving unit is connected to the second gate driving signal output terminal of an adjacent previous-stage of gate driving unit.

The start terminal of the odd-numbered rows of the first-stage of gate driving unit is connected to the first start signal input terminal, and the start terminal of the even-numbered rows of the first-stage of gate driving unit is connected to the second start signal input terminal.

According to another specific implementation, the start terminal may include a forward start terminal of odd-numbered rows, a reverse start terminal of odd-numbered rows, a forward start terminal of even-numbered rows, and a reverse start terminal of even-numbered rows. The gate driving unit may further include: a forward scanning control terminal and a reverse scanning control terminal.

Except for the first-stage of gate driving unit, the forward star terminal of odd-numbered rows of a current stage of the gate driving unit is connected to the first gate driving signal output terminal of an adjacent previous-stage of gate driving unit, and the start terminal of even-numbered rows of a current stage of the gate driving unit is connected to the second gate driving signal output terminal of the adjacent previous-stage of gate driving unit.

The forward start terminal of the odd-numbered rows of the first-stage of gate driving unit is connected to the first forward start signal input terminal, and the forward start terminal of the even-numbered rows of the first-stage of gate driving unit is connected to the second forward start signal input terminal.

Except for the last-stage of gate driving unit, the reverse start terminal of odd-numbered rows of a current stage of gate driving unit is connected to the first gate driving signal output terminal of the adjacent next-stage of gate driving unit. The reverse start terminal of the even-numbered rows of a current stage of the gate driving unit is connected to the second gate driving signal output terminal of the adjacent next-stage of gate driving unit.

The reverse start terminal of odd-numbered rows of the last-stage of gate driving unit is connected to the first reverse start signal input terminal, and the reverse start terminal of even-numbered rows of the last-stage of gate driving unit is connected to the second reverse start signal input terminal.

Optionally, the first clock signal terminal of the (2n-1)th stage of gate driving unit is connected to the first clock signal input terminal, and the second clock signal terminal of the (2n-1)th stage of gate driving unit is connected to the second clock signal input terminal, the first clock signal terminal of the (2n-1)th stage of gate driving unit is connected to the fifth clock signal input terminal, the second clock signal terminal of the (2n-1)th stage of gate driving unit is connected to the sixth clock signal input terminal.

The first clock signal terminal of the (2n)th stage of gate driving unit is connected to a third clock signal input terminal, the second clock signal terminal of the (2n)th stage of gate driving unit is connected to a fourth clock signal input terminal, the first clock signal terminal of the (2n)th stage of gate driving unit is connected to a seventh clock signal input terminal, the second clock signal terminal of the (2n)th stage of gate driving unit is connected to an eighth clock signal input terminal, n is a positive integer.

Figure 11:
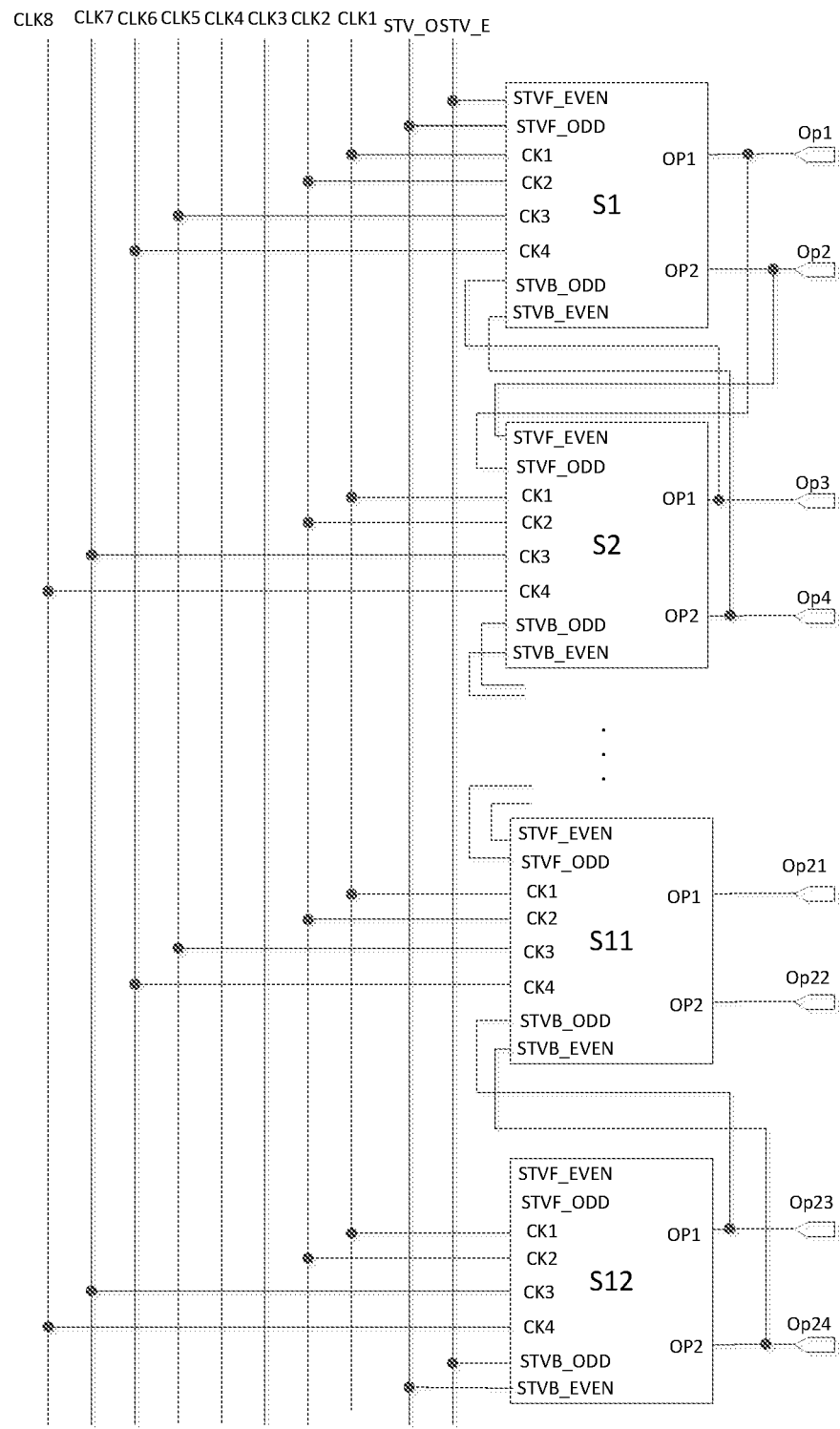
FIG. 11 is a structural diagram of a gate driving circuit according to at least one embodiment of the present disclosure.

As shown in FIG. 11, the gate driving circuit according to at least one embodiment of the present disclosure includes a plurality of stages of the above-mentioned gate driving units.

The start terminal of the gate driving unit includes a forward start terminal of odd-numbered rows STVF_ODD, a reverse start terminal of odd-numbered rows STVB_ODD, a forward start terminal of even-numbered rows STVF_EVEN, and a reverse start terminal of odd-numbered rows STVB_ODD.

OP1 of an odd-numbered stage of gate driving unit is connected to the forward start terminal of even-numbered rows STVF_EVEN of the adjacent next-stage of gate driving unit (the even-numbered stage of gate driving unit), and OP2 of the odd-numbered stage of gate driving unit is connected to the forward start terminal of the odd-numbered rows STVF_ODD of the adjacent next-stage of the gate driving unit (even-numbered stage of gate driving unit); OP2 of the even-numbered stage of gate driving unit is connected to the reverse start terminal of even-numbered rows of the adjacent previous stage of gate driving unit (odd-numbered stage of gate driving unit), and OP1 of the even-numbered stage of gate driving unit is reverse start terminal of odd-numbered rows of an adjacent previous stage of gate driving stage (odd-numbered stage of gate driving unit).

OP1 of an even-numbered stage of gate driving unit is connected to the forward start terminal of even-numbered rows STVF_EVEN of the adjacent next-stage of gate driving unit (an odd-numbered stage of gate driving unit), and OP2 of the even-numbered stage of gate driving unit is connected to the forward start terminal of the odd-numbered rows STVF_ODD of the adjacent next-stage of the gate driving unit (an odd-numbered stage of gate driving unit); OP2 of the odd-numbered stage of gate driving unit is connected to the reverse start terminal of even-numbered rows of the adjacent previous stage of gate driving unit (even-numbered stage of gate driving unit), and OP1 of the odd-numbered stage of gate driving unit is reverse start terminal of odd-numbered rows of an adjacent previous stage of gate driving stage (even-numbered stage of gate driving unit).

In addition, the first clock signal terminal CK1 of the odd-numbered stage of gate driving unit is connected to the first input clock signal terminal CLK1, and the second clock signal terminal CK2 of the odd-numbered stage of gate driving unit is connected to the second input clock signal terminal CLK2, and third clock signal terminal CK3 of the odd-numbered stage of the gate driving unit is connected to the fifth input clock signal terminal CLK5, and the fourth clock signal terminal CK4 of the odd-numbered stage of gate driving unit is connected to the sixth input clock signal terminal CLK6; the first clock signal terminal CK1 of the even-numbered stage of gate driving unit is connected to the third input clock signal terminal CLK3, the second clock signal terminal CK2 of the even-numbered stage of gate driving unit is connected to the fourth input clock signal terminal CLK4, and the third clock signal terminal CK3 of the even-numbered stage of gate driving unit is connected to the seventh input clock signal terminal CLK7, and the fourth clock signal terminal CK4 of the even-numbered stage of gate driving unit is connected to the eighth input clock signal terminal CLK8.

In FIG. 11, the reference STV_O represents a start signal of odd-numbered rows, and the reference STV_E represents a start signal of even-numbered rows.

In FIG. 11, four stages of gate driving unit is schematically shown, wherein the reference numeral S1 represents a first stage of gate driving unit, the reference numeral S2 represents a second stage of gate driving unit, and the reference numeral S11 represents the eleventh stage of gate driving unit, and the reference number S12 represents the twelfth stage of gate driving unit.

In FIG. 11, the first gate driving signal output terminal of S1 is labeled Op1, the second gate driving signal output terminal of S1 is labeled Op2, and the first gate driving signal output terminal of S2 is labeled Op3, the second gate driving signal output terminal of S2 is labeled Op4; the first gate driving signal output terminal of S11 is labeled Op21, and the second gate driving signal output of S11 is labeled Op22, the first gate driving signal output terminal of S12 is labeled Op23, and the second gate driving signal output terminal of S12 is labeled Op24.

Opt is connected to the gate line in the first row, Op2 is connected to the gate line in the second row, Op3 is connected to the gate lien in the third row, Op4 is connected to the gate line in the fourth row, Op21 is connected to the gate line in the twenty-first row, and Op22 is connected to the gate line in the twenty-second row, Op23 is connected to the gate line in the twenty-third row, and Op24 is connected to the gate line in the twenty-fourth row.

Figure 12:
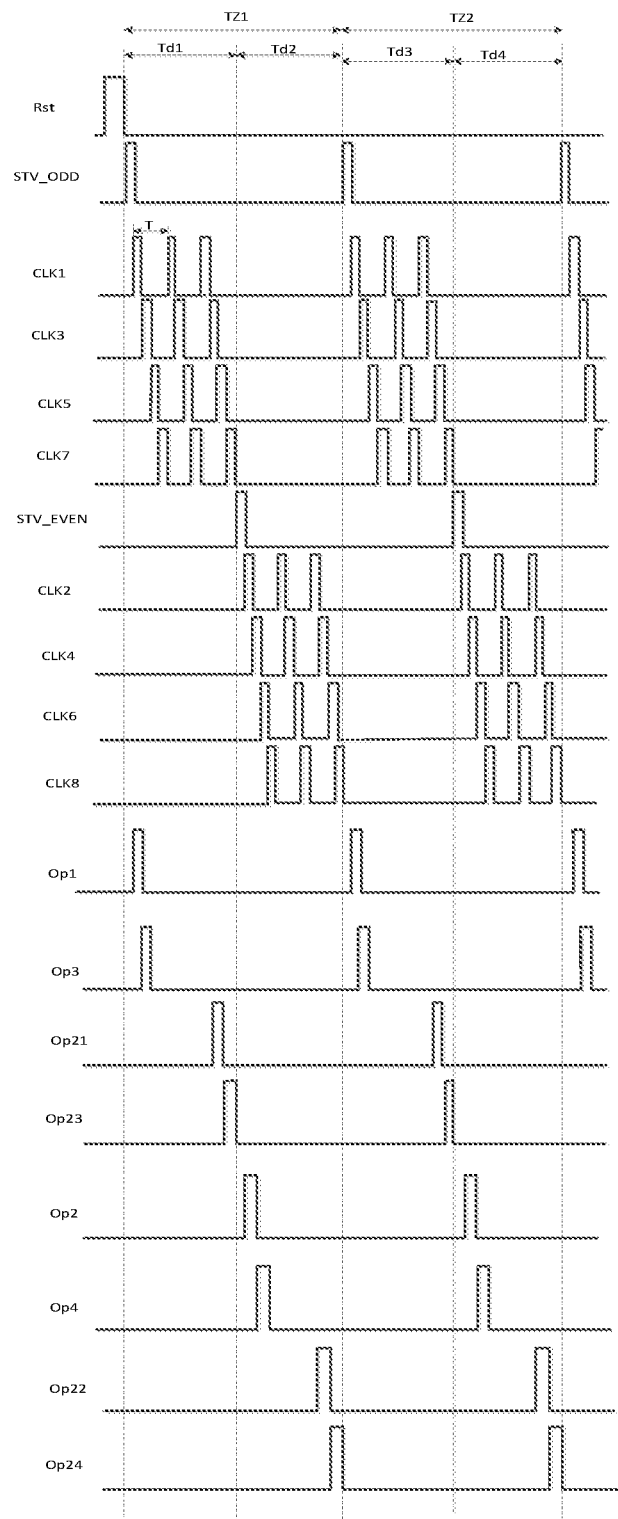
FIG. 12 is a time sequence diagram showing the operation of the gate driving circuit during forward scanning according to at least one embodiment of the present disclosure.

As shown in FIG. 12, when the gate driving circuit according to at least one embodiment of the present disclosure shown in FIG. 11 performs forward scanning, the first frame of image display time TZ1 is divided into a first display period Td1 and a second display period Td2. The second frame of image display periods Td2 is divided into a third display period Td3 and a fourth display period Td4.

In the first display period Td1 and the third display period Td3, the first input clock signal provided by CLK1, the third input clock signal provided by CLK3, the fifth input clock signal provided by CLK5, and the seventh input clock signal provided by CLK7 are clock signals. The period of the clock signal is T, the third input clock signal is delayed T/4 from the first input clock signal, the fifth input clock signal is delayed T/4 from the third input clock signal, and the seventh input clock signal is delayed T/4 from the fifth Input clock signal.

In the second display period Td2 and the fourth display period Td4, the first input clock signal provided by CLK1, the third input clock signal provided by CLK3, the fifth input clock signal provided by CLK5, and the seventh input clock signal provided by CLK7 are all at a low level.

In the first display period Td1 and the third display period Td3, the second input clock signal provided by CLK2, the fourth input clock signal provided by CLK4, the sixth input clock signal provided by CLK6, and the eighth input clock signal provided by CLK8 are all at a low level.

In the second display period Td2 and the fourth display period Td4, the second input clock signal provided by CLK2, the fourth input clock signal provided by CLK4, the sixth input clock signal provided by CLK6, and the eighth input clock signal provided by CLK8, the period of the clock signal is T. The fourth input clock signal is delayed T/4 from the second input clock signal, the sixth input clock signal is delayed T/4 from the fourth input clock signal, and the eighth input clock signal is delayed T/4 from the sixth input clock signal.

As shown in FIG. 12, when the gate driving circuit according to at least one embodiment of the present disclosure shown in FIG. 11 performs a forward scan, in the first display period Td1 and the third display period Td3, the gate driving signal output terminals of the odd-numbered rows outputs a gate driving signal row by row from top to bottom, and the gate driving signal output terminals of the even-numbered rows output a low level; that is, in Td1 and Td3, Op1, Op3, . . . , Op21, Op23 output a high level in sequence, Op2, Op4, . . . , Op22, Op24 all output a low level.

In the second display period Td2 and the fourth display period Td4, the gate driving signal output terminals of the even-numbered rows output the gate driving signal row by row from the top to the bottom, and the gate driving signal output terminals of the odd-numbered rows output a low level; that is, in Td1 and Td3, Op2, Op4, . . . , Op22, Op24 output a high level in sequence, and Op1, Op3, . . . , Op21, Op23 all output a low level.

As shown in FIG. 11, when the gate driving circuit according to at least one embodiment of the present disclosure performs a forward scan, in the first display period Td1 and the third display period Td3, each stage of the gate driving unit outputs a corresponding gate driving signal through its first gate driving signal output terminal from top to bottom of all stages of gate driving units. In the second display period Td2 and the fourth display period Td4, each stage of the gate driving unit outputs a corresponding gate driving signal through its second gate driving signal output terminal from top to bottom of all stages of gate driving units.

As shown in FIG. 12, in at least one embodiment of the present disclosure, the refresh frequency is reduced from 60 HZ to 30 HZ, which can significantly reduce the power consumption of the display panel. In at least one embodiment of the present disclosure, the gate driving signal in odd-numbered rows and even-numbered rows are outputted alternately, the pulse width of CLK is guaranteed to be equal to the refresh rate, that is 60 HZ. In the first half frame of image display time, GOAs in odd-numbered rows are operated, and in the second half frame of image display time, GOAs in even-numbered rows are operated, which can achieve low power consumption.

In specific implementation, the power consumption of the display panel may be reduced by reducing the refresh frequency. However, if the refresh frequency is reduced, the existing gate driving that sequentially scans all the gate lines from the top to the bottom in one frame of display time is used, due to the increase of one frame of image display time, when the gate lines below the display panel is scanned, the brightness of the pixel circuit driven by the gate lines above the display panel cannot be maintained, resulting in increased flicker. In at least one embodiment of the present disclosure, one frame of display time is divided into two display periods. In one display period, gate lines in even-numbered rows are sequentially scanned. In another display period, gate lines in odd-numbered rows are sequentially scanned. Since the duration of one display period is only half of one frame of image display time, after scanning the gate line in even-numbered rows, the gate line in the odd-numbered rows are sequentially scanned from top to bottom in the other display period, so that the plurality of rows of pixel circuits connected to the gate lines in odd-numbered rows emit light sequentially, thereby reducing flicker.

Figure 13:
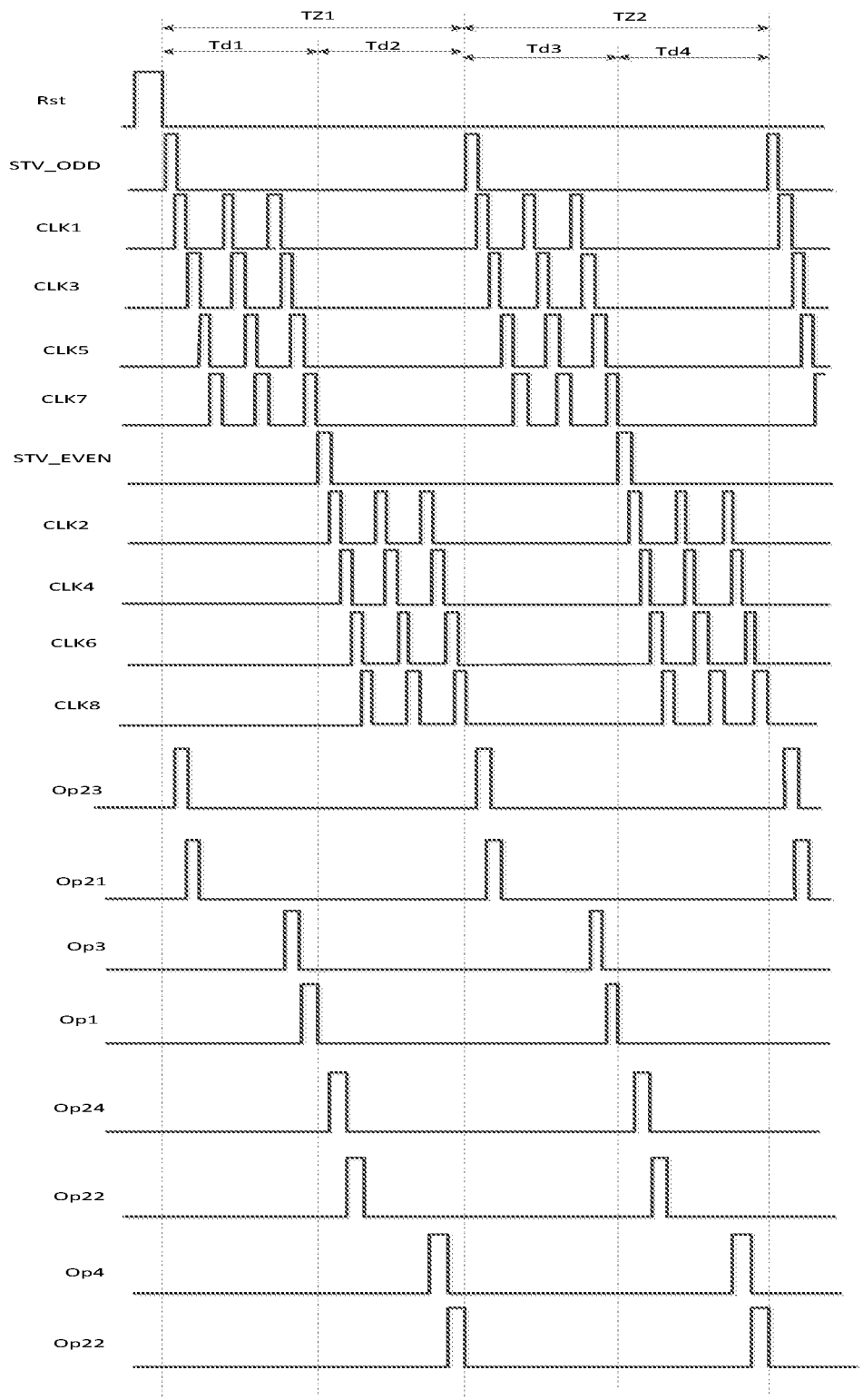
FIG. 13 is a time sequence diagram showing the operation of the gate driving circuit during reverse scanning according to at least one embodiment of the present disclosure.

As shown in FIG. 13, when the gate driving circuit according to at least one embodiment of the present disclosure shown in FIG. 11 performs forward scanning, the first frame of image display time TZ1 is divided into a first display period Td1 and a second display period Td2. The second frame of image display time TZ2 is divided into a third display period Td3 and a fourth display period Td4.

In the first display period Td1 and the third display period Td3, the first input clock signal provided by CLK1, the third input clock signal provided by CLK3, the fifth input clock signal provided by CLK5, and the seventh input clock signal provided by CLK7 are clock signals, the period of the clock signal is T, the third input clock signal is delayed T/4 from the first input clock signal, the fifth input clock signal is delayed T/4 from the third input clock signal, and the seventh input clock signal is delayed T/4 from the fifth input clock signal.

In the second display period Td2 and the fourth display period Td4, the first input clock signal provided by CLK1, the third input clock signal provided by CLK3, the fifth input clock signal provided by CLK5, and the seventh input clock signal provided by CLK7 are at a low level.

In the first display period Td1 and the third display period Td3, the second input clock signal provided by CLK2, the fourth input clock signal provided by CLK4, the sixth input clock signal provided by CLK6, and the eighth input clock signal provided by CLK8 are at a low level.

In the second display period Td2 and the fourth display period Td4, the second input clock signal provided by CLK2, the fourth input clock signal provided by CLK4, the sixth input clock signal provided by CLK6, and the eighth input clock signal provided by CLK8, the period of the clock signal is T. The fourth input clock signal is delayed T/4 from the second input clock signal, the sixth input clock signal is delayed T/4 from the fourth input clock signal, and the eighth input clock signal is delayed T/4 from the sixth input clock signal.

As shown in FIG. 13, when the gate driving circuit according to at least one embodiment of the present disclosure shown in FIG. 11 performs reverse scanning, in the first display period Td1 and the third display period Td3, the gate driving signal output terminals in the odd-numbered rows output a gate driving signal row by row from top to bottom, and the gate driving signal output terminals in the even-numbered rows output a low level; that is, in Td1 and Td3, Op23, Op21, . . . , Op3, Op1 output a high level in sequence, Op24, Op22, . . . , Op4, Op2 all output a low level.

In the second display period Td2 and the fourth display period Td4, the gate driving signal output terminal in the even-numbered rows output a gate driving signal row by row from top to bottom, and the gate driving signal output terminals in odd-numbered rows output a low level; that is, in Td1 and Td3, Op2, Op4, . . . , Op22, Op24 output a high level in sequence, and Op1, Op3, . . . , Op21, Op23 all output a low level.

As shown in FIG. 11, when the gate driving circuit according to at least one embodiment of the present disclosure performs reverse scanning, in a first display period Td1 and a third display period Td3, each stage of gate driving unit outputs a corresponding gate driving signal through its first gate driving signal output terminal from bottom to up of all stages of gate driving units, in a second display period Td2 and a fourth display period Td4, each stage of gate driving unit outputs a corresponding gate driving signal through its second gate driving signal output terminal from bottom to up of all stages of gate driving units.

The gate driving method according to at least one embodiment of the present disclosure is applied to the above-mentioned gate driving circuit. A frame of image display time includes a first display period and a second display period. The gate driving method includes: in a first display period, all gate driving units included in the gate driving circuit successively output a valid voltage through its first gate driving signal output terminal; in the second display period, all gate driving units included in the gate driving circuit successively output a valid voltage through its second gate driving signal output terminal.

In the gate driving method according to an embodiment, a gate driving signal of odd-numbered rows and a gate driving signal of even-numbered rows are outputted alternately, which can reduce the refresh frequency. However, the pulse width of the clock signal is consistent with that of the high refresh frequency, which can reduce the risk of Flicker while achieving low power consumption. In addition, in the gate driving method according to at least one embodiment of the present disclosure, two-stage output of gate driving signals may be provided and the wiring space of the display panel frame is increased.

Optionally, the first display period may include M display phases that are sequentially set, and the second display period includes M display phases that are sequentially set, where M is a total number of stages of the gate driving units included in the gate driving circuit.

The gate driving method includes: during forward scanning, in the m-th display phase in the first display period, the m-th gate driving unit included in the gate driving circuit outputs a valid voltage through its first gate driving signal output terminal; in the m-th display phase in the second display period, the m-th gate driving unit included in the gate driving circuit outputs a valid voltage through its second gate driving signal output terminal; M is an integer greater than 1, and m is a positive integer less than or equal to M.

Optionally, the first display period may include M display phases that are sequentially set, and the second display period may include M display phase that are sequentially set, where M is a total number of stages of the gate driving units included in the gate driving circuit.

The gate driving method includes: during reverse scanning, in the m-th display phase in the first display period, the (M-m+1)th stage of gate driving unit included in the gate driving circuit outputs a valid voltage through its first gate driving signal output terminal; in the m-th display phase in the second display period, the (M-m+1)th stage of gate driving unit included in the gate driving circuit outputs a valid voltage through its second gate driving signal output terminal; M is an integer greater than 1, and m is a positive integer less than or equal to M.

The display panel according to at least one embodiment of the present disclosure includes a display substrate, and the display panel further includes gate lines in 2M rows and the above-mentioned gate driving circuit provided on the display substrate; M is the total number of stages of gate driving units included in the gate driving circuit.

The first gate driving signal output terminal of the m-th stage of gate driving unit of the gate driving circuit is connected to the gate line in the (2m-1)th row; the second gate driving signal output terminal of the m-th stage of gate driving unit of the gate driving circuit is connected to the gate line in (2m)th row; M is an integer greater than 1, and m is a positive integer less than or equal to M.

Optionally, the display panel may include one of the gate driving circuits, and a first gate driving signal output terminal of an m-th gate driving unit of the gate driving circuit is connected to the gate line in the (2m-1)th row. The second gate driving signal output terminal of the m-th gate driving unit of the gate driving circuit is connected to the gate line in the (2m)th row, so as to provide the gate driving signal for the gate line in the odd-numbered rows through the first gate driving signal output terminal, and provide a gate driving signal to the gate line in the even-numbered rows through the second gate driving signal output terminal.

The display panel according to at least one embodiment of the present disclosure includes a display substrate, and the display panel further includes gate line in 2M rows and two gate driving circuits described above; M is the total number of stages of the gate driving units included in the gate driving circuit.

The first gate driving signal output terminal of the m-th stage of gate driving unit of the first gate driving circuit is connected to the left terminal of the gate line in the (2m-1)th row; the second gate driving signal output terminal of the m-th stage of gate driving unit of the first gate driving circuit is connected to the left terminal of the gate line in the (2m)th row. The first gate driving signal output terminal of the m-th stage of gate driving unit of the second gate driving circuit is connected to the right terminal of the gate line in the (2m-1)th row; the second gate driving signal output terminal of the m-th stage of gate driving unit of the second gate driving circuit is connected to the right terminal of the gate line in the (2m)th row; M is an integer greater than 1, and m is a positive integer less than or equal to M.

Optionally, the display panel may include two gate driving circuits, a first gate driving signal output terminal of an m-th stage of gate driving unit included in the first gate driving circuit is connected to the left terminal of the gate line in the (2m-1)th row, and the second gate driving signal output terminal of the m-th stage of gate driving unit of the first gate driving circuit is connected to the left terminal of the gate line in the (2m)th row. A gate driving signal is provided to the left terminal of the gate lines in odd-numbered rows through the first gate driving signal output terminal, and the gate driving signal is provided to the left terminal of the gate lines in even-numbered rows through the second gate driving signal output terminal. A first gate driving signal output terminal of an m-th stage of gate driving unit included in the second gate driving circuit is connected to the right terminal of the gate line in the (2m-1)th row, and the second gate driving signal output terminal of the m-th stage of gate driving unit of the second gate driving circuit is connected to the right terminal of the gate line in the (2m)th row. A gate driving signal is provided to the right terminal of the gate lines in odd-numbered rows through the first gate driving signal output terminal, and the gate driving signal is provided to the right terminal of the gate lines in even-numbered rows through the second gate driving signal output terminal.

The display panel according to at least one embodiment of the present disclosure can be applied to a large-size and high-resolution display panel by using two gate driving circuits to provide gate driving signals to both terminals of a gate line, respectively. For a large-size and high-resolution display panel, the load of the GOA output is inconsistent at the far terminal and the near terminal due to unilateral driving, which will further cause insufficient charging or other charging problems due to different charging capability of pixels at the far terminal and the near terminal. In order to enhance the output stability of GOA circuit and achieve the consistent output at the far terminal and the near terminal, the display panel according to at least one embodiment of the present disclosure adopts a bilateral driving manner. Since a gate driving unit included in a gate driving circuit in the display panel according to at least one embodiment of the present disclosure can drive gate lines in two rows, the space can be saved, the size of the display panel frame can be prevented from being too large, and bilateral output can be achieved in a wiring space of single stage of output.

At present, the development direction of the shape of the display panel is anisotropic peripheral R-arc angle, the middle U-shaped groove and a narrow frame design are required. GOA adopts unidirectional scanning, and there are no pixels in the middle U-shaped groove, so wiring is needed for the pixels at the left and right sides to achieve gate driving, the wiring will occupy a large space at the U-shaped groove, and the deeper the U-shaped groove is, the larger the frame space is, it is difficult to meet the requirements of a narrow frame. Based on this, in at least one embodiment of the present disclosure, gate driving circuits are provided on both sides of the display panel, the gate driving circuit on the left side is connected to the left terminal of a corresponding gate line, and the gate driving circuit on the right side is connected to the right terminal of the corresponding gate line. Wiring is not needed for gate driving, which is beneficial to the narrow frame design at the U-shaped groove.

Figure 14:
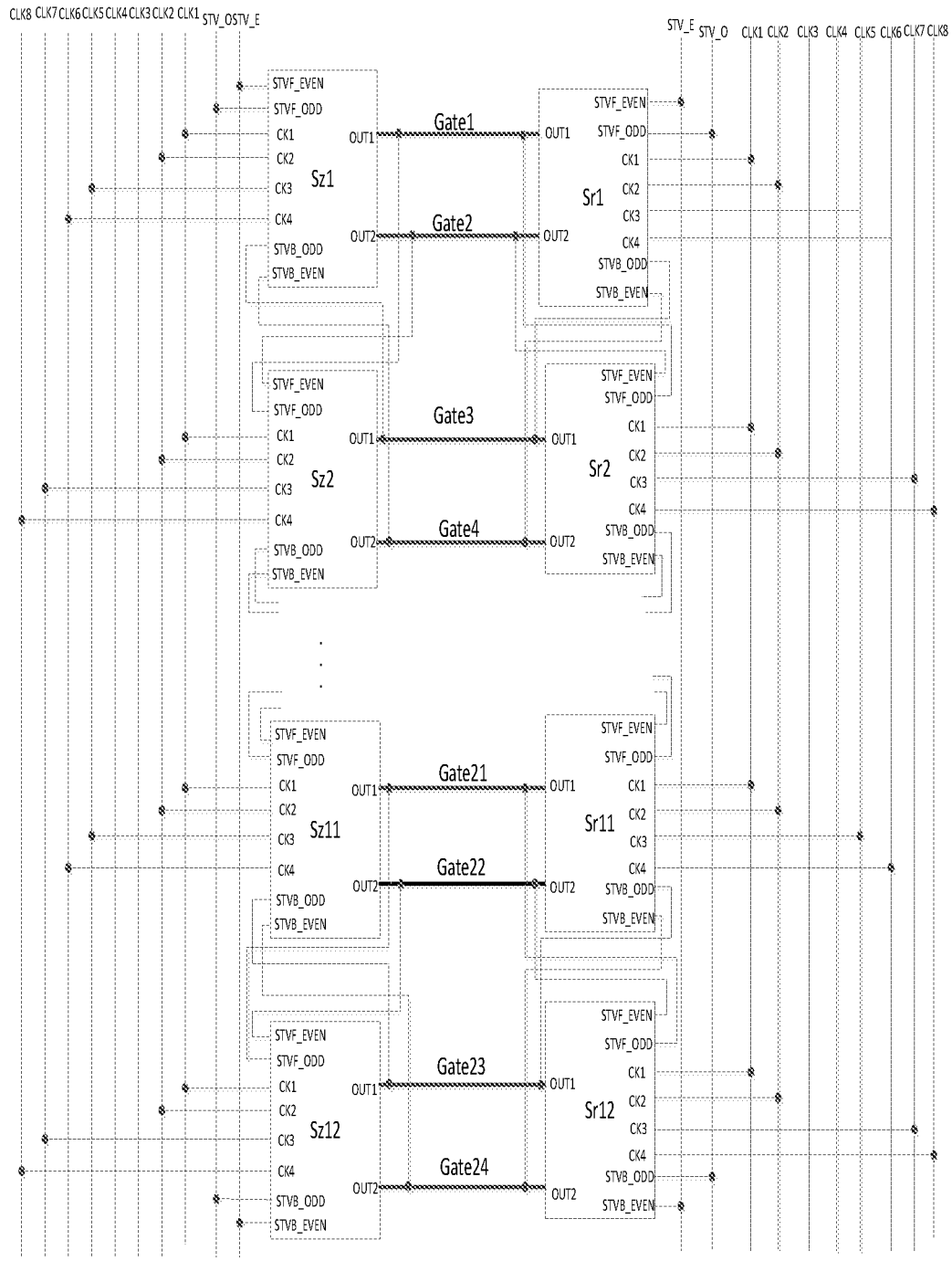
FIG. 14 is a schematic diagram illustrating a connection relationship between two gate driving circuits and a plurality of gate lines included in a display panel according to at least one embodiment of the present disclosure.

As shown in FIG. 14, the display panel according to at least one embodiment of the present disclosure includes a plurality of gate lines, a first gate driving circuit, and a second gate driving circuit.

FIG. 14 illustrates a gate line in the first row GL1, a gate line in the second row GL2, a gate line in the third row GL3, a gate line in the fourth row GL4, a gate line in the twenty-first row GL21, and a gate line in the twenty-second row GL22, a gate line in the twenty-third row GL23, and a gate line in the twenty-fourth row GL24.

The first gate driving signal output terminal of the first-stage of gate driving unit Sz1 included in the first gate driving circuit is connected to the left terminal of the gate line in the first row GL1; the first gate driving signal output terminal of the first stage of gate driving unit Sr1 is connected to the right terminal of the gate line in the first row GL1. The second gate driving signal output terminal of the first stage of gate driving unit Sz1 included in the first gate driving circuit is connected to the left terminal of the gate line in the second row GL2; the second gate driving signal output terminal of the first stage of gate driving unit Sr1 is connected to the right terminal of the gate line in the second row GL2.

The first gate driving signal output terminal of the second-stage of gate driving unit Sz2 included in the first gate driving circuit is connected to the left terminal of the gate line in the third row GL3; the first gate driving signal output terminal of the second stage of gate driving unit Sr2 is connected to the right terminal of the gate line in the third row GL3. The second gate driving signal output terminal of the second stage of gate driving unit Sz2 included in the first gate driving circuit is connected to the left terminal of the gate line in the fourth row GL4; the second gate driving signal output terminal of the second stage of gate driving unit Sr2 is connected to the right terminal of the gate line in the fourth row GL4.

The first gate driving signal output terminal of the eleventh stage of gate driving unit Sz11 included in the first gate driving circuit is connected to the left terminal of the gate line in the twenty-first row GL21; the first gate driving signal output terminal of the eleventh stage of gate driving unit Sr11 is connected to the right terminal of the gate line in the twenty-first row GL21. The second gate driving signal output terminal of the eleventh stage of gate driving unit Sz11 included in the first gate driving circuit is connected to the left terminal of the gate line in the twenty-second row GL22; the second gate driving signal output terminal of the eleventh stage of gate driving unit Sr11 is connected to the right terminal of the gate line in the twenty-second row GL22.

The first gate driving signal output terminal of the twelfth stage of gate driving unit Sz12 included in the first gate driving circuit is connected to the left terminal of the gate line in the twenty-third row GL23; the first gate driving signal output terminal of the twelfth stage of gate driving unit Sr12 is connected to the right terminal of the gate line in the twenty-third row GL23. The second gate driving signal output terminal of the twelfth stage of gate driving unit Sz12 included in the first gate driving circuit is connected to the left terminal of the gate line in the twenty-fourth row GL24; the second gate driving signal output terminal of the twelfth stage of gate driving unit Sr12 is connected to the right terminal of the gate line in the twenty-fourth row GL24.

In specific implementation, the first gate driving circuit is disposed on the left side of the display substrate, and the second gate driving circuit is disposed on the right side of the display substrate.

In FIG. 14, CK1 denotes the first clock signal terminal, CK2 denotes the second clock signal terminal, CK3 denotes the third clock signal terminal, and CK4 denotes the fourth clock signal terminal. CLK1 denotes the first input clock signal terminal, CLK2 denotes the second input clock signal terminal, CLK3 denotes the third input clock signal terminal, CLK4 denotes the fourth input clock signal terminal, CLK5 denotes the fifth input clock signal terminal, CLK6 denotes the sixth input clock signal terminal, CLK7 denotes the seventh input clock signal terminal, CLK8 denotes the eighth input clock signal terminal, and STVF_ODD denotes the forward start terminal in the odd-numbered rows. STV-B_ODD denotes the reverse start terminal in the odd-numbered rows. STVF_EVEN denotes the forward start terminal in the even-numbered rows. STV_E denotes the start signal in even-numbered rows. OUT1 denotes the first gate driving signal output terminal, OUT2 denotes the second gate driving signal output terminal.

The display device according to at least one embodiment of the present disclosure includes the display panel described above.

The display device provided in at least one embodiment of the present disclosure may be any product or component having a display function, such as a mobile phone, a tablet computer, a television, a display, a notebook computer, a digital photo frame, a navigator, and the like.

In the gate driving unit, the gate driving method, a gate driving circuit, a display panel and a display device according to at least one embodiment of the present disclosure, a frame of display time is divided into two display periods, and in an output phase included in one display period, a gate driving signal is outputted. In the gate driving method according to an embodiment, a gate driving signal of odd-numbered rows and a gate driving signal of even-numbered rows are outputted alternately, which can reduce the refresh frequency. However, the pulse width of the clock signal is consistent with that of the high refresh frequency, which can reduce the risk of flicker while achieving low power consumption. In addition, in the gate driving method according to at least one embodiment of the present disclosure, two-level gate driving signal output may be provided and the wiring space of the display panel frame is increased.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driving unit, comprising a start terminal, a first gate driving signal output terminal, a second gate driving signal output terminal,
   a pull-up control node control circuit, configured to control and maintain a potential of a pull-up control node to be a valid voltage under the control of a start signal inputted by a start terminal, and control the potential of the pull-up control node to be an invalid voltage under the control of a potential of a pull-down node;
   a pull-up node control circuit, configured to control a potential of a first pull-up node and a potential of a second pull-up node based on the potential of the pull-up control node;
   a first gate driving signal output circuit, configured to control the connection of a first gate driving signal output terminal and a first clock signal terminal under the control of the potential of the first pull-up node, and control to reset a first gate driving signal outputted from the first gate driving signal output terminal under the control of the potential of the pull-down node;
   a second gate driving signal output circuit, configured to control the connection of a second gate driving signal output terminal and a second clock signal terminal under the control of the potential of the second pull-up node, and control to reset the second gate driving signal outputted from the second gate driving signal output terminal under the control of the potential of the pull-down node; and
   a pull-down node control circuit, configured to control and maintain the potential of the pull-down node under the control of a third clock signal inputted by a third clock signal terminal and a fourth clock signal inputted by a fourth clock signal terminal, and control to reset the potential of the pull-down node under the control of the potential of the pull-up control node,
   wherein the pull-down node control circuit comprises:
   a first pull-down node control transistor, a control electrode of the first pull-down node control transistor being directly connected to a first electrode of the first pull-down node control transistor, both the control electrode and the first electrode being directly connected to the third clock signal terminal, and a second electrode of the first pull-down node control transistor being connected to the pull-down node;
   a second pull-down node control transistor, a control electrode of the second pull-down node control transistor being directly connected to a second electrode of the second pull-down node control transistor, both the control electrode and the second electrode of the second pull-down node control transistor being directly connected to the fourth clock signal terminal, and the first electrode of the second pull-down node control transistor being connected to the pull-down node;
   a third pull-down node control transistor, a control electrode thereof being connected to the pull-up control node, a first electrode thereof being connected to the pull-down node, and a second electrode thereof being connected to a second voltage terminal; and
   a pull-down node maintenance capacitor, a first end thereof being connected to the pull-down node, and a second end thereof being connected to a fourth voltage terminal,
   wherein the start terminal comprises a forward start terminal of odd-numbered rows, a reverse start terminal of odd-numbered rows, a forward start terminal of even-numbered rows and a reverse start terminal of even-numbered rows; the gate driving unit further comprises a forward scan control terminal and a reverse scan control terminal,
   the pull-up control node control circuit is configured to, during the forward scanning, under the control of the forward scanning control signal inputted by the forward scanning control terminal, when the valid voltage is inputted by the forward start terminal of the odd-numbered rows, control the potential of the pull-up control node to be a valid voltage, and when a valid voltage is inputted by the forward start terminal of even-numbered rows, control and maintain the potential of the pull-up control node as a valid voltage;
   the pull-up control node control circuit is configured to, during the reverse scanning, under the control of the reverse scanning control signal inputted by the reverse scanning control terminal, when the valid voltage is inputted by the reverse start terminal of odd-numbered rows, control the potential of the pull-up control node to be a valid voltage, and when the valid voltage is inputted by the reverse start terminal of even-numbered rows, control and maintain the potential of the pull-up control node as a valid voltage.

2. The gate driving unit according to claim 1, wherein the start terminal comprises a start terminal of odd-numbered rows and a start terminal of even-numbered rows, the pull-up control node control circuit is configured to control and maintain the potential of the pull-up control node to be a valid voltage when a valid voltage is inputted by the start terminal of odd-numbered rows, and control and maintain the potential of the pull-up control node to be a valid voltage when a valid voltage is inputted by the start terminal of even-numbered rows, and control the potential of the pull-up control node to be an invalid voltage when the potential of the pull-down node is a valid voltage.

3. The gate driving unit according to claim 2, wherein the pull-up control node control circuit comprises:

a first transistor, a control electrode thereof being connected to the start terminal of odd-numbered rows, a first electrode thereof being connected to the first voltage terminal, and a second electrode thereof being connected to the pull-up control node;

a second transistor, a control electrode thereof being connected to the start terminal of even-numbered rows, a first electrode thereof being connected to the first voltage terminal, and a second electrode thereof being connected to the pull-up control node;

a pull-up control node pull-down transistor, a control electrode thereof being connected to the pull-down node, a first electrode thereof being connected to the pull-up control node, and a second electrode thereof being connected to a second voltage terminal; and a pull-up control node maintenance capacitor, a first end thereof being connected to the pull-up control node, and a second end thereof being connected to a third voltage terminal.

4. The gate driving unit according to claim 1, wherein the pull-up control node control circuit is further configured to control the potential of the pull-up control node to an invalid voltage when the potential of the pull-down node is a valid voltage.

5. The gate driving unit according to claim 1, wherein the pull-up control node control circuit comprises:

a first forward scanning control transistor, a control electrode thereof being connected to the forward scanning control terminal, and a first electrode thereof being connected to the forward start terminal of odd-numbered rows;

a second forward scan control transistor, a control electrode thereof being connected to the forward scan control terminal, and a first electrode thereof being connected to the forward start terminal of even-numbered rows;

a first reverse scan control transistor, a control electrode thereof being connected to the reverse scan control terminal, a first electrode thereof being connected to a control electrode of a first pull-up control node control transistor, and a second electrode thereof being connected to the reverse start terminal of odd-numbered rows;

a second reverse scan control transistor, a control electrode thereof being connected to the reverse scan control terminal, a first electrode thereof being connected to a control electrode of a second pull-up control node control transistor, and a second electrode thereof being connected to the reverse start terminal of even-numbered rows;

a first pull-up control node control transistor, a control electrode thereof being connected to a second electrode of the first forward scan control transistor, a first electrode thereof being connected to the first voltage terminal, and a second electrode thereof being connected to the pull-up control node;

a second pull-up control node control transistor, a control electrode thereof being connected to the second electrode of the second forward scan control transistor, the first electrode thereof being connected to the first voltage terminal, and the second electrode thereof being connected to the pull-up control node;

a pull-up control node pull-down transistor, a control electrode thereof being connected to the pull-down node, a first electrode thereof being connected to the pull-up control node, and a second electrode thereof being connected to a second voltage terminal; and a pull-up control node maintenance capacitor, a first end thereof being connected to the pull-up control node, and a second end thereof being connected to a third voltage terminal.

6. The gate driving unit according to claim 1, further comprising a reset circuit, wherein the reset circuit is configured to control the potential of the pull-down node to be a valid voltage under the control of a blank area reset signal inputted by a blank area reset terminal.

7. The gate driving unit according to claim 1, wherein the pull-up node control circuit comprises:

a first pull-up node control transistor, a control electrode thereof being connected to a first voltage terminal, a first electrode thereof being connected to the first pull-up node, and a second electrode thereof being connected to the pull-up control node; and a second pull-up node control transistor, a control electrode thereof being connected to the first voltage terminal, a first electrode thereof being connected to the second pull-up node, and a second electrode thereof being connected to the pull-up control node.

8. The gate driving unit according to claim 1, wherein the first gate driving signal output circuit comprises a first output transistor and a first output pull-down transistor;

a control electrode of the first output transistor is connected to the first pull-up node, a first electrode of the first output transistor is connected to the first clock signal terminal, and a second electrode of the first output transistor is connected to the first gate driving signal output terminal;

a control electrode of the first output pull-down transistor is connected to the pull-down node, a first electrode of the first output pull-down transistor is connected to the first gate driving signal output terminal, and a second electrode of the first output pull-down transistor is connected to the second voltage terminal.

9. The gate driving unit according to claim 1, wherein the second gate driving signal output circuit comprises a second output transistor and a second output pull-down transistor, a control electrode of the second output transistor is connected to the second pull-up node, the first electrode of the second output transistor is connected to the second clock signal terminal, and the second electrode of the second output transistor is connected to the second gate driving signal output terminal, a control electrode of the second output pull-down transistor is connected to the pull-down node, a first electrode of the second output pull-down transistor is connected to the second gate driving signal output terminal, and a second electrode of the second output pull-down transistor is connected to the second voltage terminal.

10. The gate driving unit according to claim 1, further comprising a touch output control circuit, wherein
the touch output control circuit is configured to control both the first gate driving signal output terminal and the second gate driving signal output terminal to output an invalid voltage under the control of a touch output control signal inputted by the touch output control terminal.

11. The gate driving unit according to claim 1, further comprising a screen off control circuit,
wherein the screen off control circuit is configured to control both the first gate driving signal output terminal and the second gate driving signal output terminal to output a valid voltage under the control of a screen off control signal inputted by the screen off control terminal.

12. A gate driving method for driving the gate driving unit according to claim 1, wherein a frame of display time comprises a first display period and a second display period, and the first display period comprises a first input phase and a first output phase in sequence; the second display period comprises a second input phase and a second output phase in sequence; and the gate driving method comprises:
in the first input phase and the second input phase, controlling, by the pull-up control node control circuit, the potential of the pull-up control node to be a valid voltage under the control of the start signal, and controlling, by the pull-up node control circuit, the potential of the first pull-up node and the potential of the second pull-up node to be valid voltages based on the potential of the pull-up control node;
in the first output phase, maintaining, by the pull-up control node control circuit, the potential of the pull-up control node as a valid voltage, the valid voltage being inputted by the first clock signal terminal, and controlling, by the first gate driving signal output circuit, the connection of the first gate driving signal output terminal and the first clock signal terminal under the potential of the first pull-up node, to control the first gate driving signal output terminal to output a valid voltage;
in the second output phase, maintaining, by the pull-up control node control circuit, the potential of the pull-up control node as a valid voltage, a valid voltage being inputted by the second clock signal terminal, and controlling, by the second gate driving signal output circuit, the connection of the second gate driving signal output terminal and the second clock signal terminal under the control of the potential of the second pull-up node, to control the second gate driving signal output terminal to output a valid voltage.

13. The gate driving method according to claim 12, wherein the first display period further comprises a first output reset phase and a first pull-down node control phase set after the first output phase, and the second display period further comprises the second output reset phase and the second pull-down node control phase set after the second output phase, the gate driving method further comprises:
in the first output reset phase, maintaining, by the pull-up control node control circuit, the potential of the pull-up control node as a valid voltage, an invalid voltage being inputted by the first clock signal terminal, and controlling, by the first gate driving signal output circuit, the connection of the first gate driving signal output terminal and the first clock signal terminal under the control of the potential of the first pull-up node, to control the first gate driving signal output terminal to output an invalid voltage;
in the first pull-down node control phase, a valid voltage being inputted by the third clock signal terminal, controlling, by the pull-down node control circuit, the voltage of the pull-down node to be a valid voltage under the control of the third clock signal, and controlling, by the first gate driving signal output circuit, to reset the first gate driving signal outputted from the first gate driving signal output terminal under the control of the potential of the pull-down node;
in the second output reset phase, maintaining, by the pull-up control node control circuit, the potential of the pull-up control node as a valid voltage, an invalid voltage being inputted by the second clock signal terminal, and controlling, by a second gate driving signal output circuit, the connection of the second gate driving signal output terminal and the second clock signal terminal under the control of the potential of the second pull-up node, to control the second gate driving signal output terminal to output an invalid voltage; and
in the second pull-down node control phase, the valid voltage being inputted by the fourth clock signal terminal, controlling, by the pull-down node control circuit, the voltage of the pull-down node to be a valid voltage under the control of the fourth clock signal, and controlling, by the second gate driving signal output circuit, to reset the second gate driving signal outputted from the second gate driving signal output terminal under the control of the potential of the pull-down node.

14. The gate driving method according to claim 13, wherein the first display period further comprises a first output cutoff maintenance phase set after the first pull-down node control phase, and the second display period further comprises a second output cut-off maintenance phase set after the second pull-down node control phase, the gate driving method further comprises:
in the first output cut-off maintenance phase, maintaining, by the pull-down node control circuit, the voltage of the pull-down node as a valid voltage, and controlling, by the first gate driving signal output circuit, to reset the first gate driving signal outputted from the first gate driving signal output terminal under the control of the potential of the pull-down node; and
in the second output cut-off maintenance phase, maintaining, by the pull-down node control circuit, the voltage of the pull-down node as a valid voltage, and controlling, by the second gate driving signal output circuit, to reset the second gate driving signal outputted from the second gate driving signal output terminal under the control of the potential of the pull-down node.

15. The gate driving method according to claim 12, further comprising:
in the first input phase and the second input phase, an invalid voltage being inputted by the first clock signal terminal and the second clock signal terminal, and controlling, by the first gate driving signal output circuit, the connection of the first gate driving signal output terminal and the first clock signal terminal under the control of the potential of the first pull-up node, to control the first gate driving signal output terminal to output an invalid voltage, and controlling, by the second gate driving signal output circuit, the connection of the second gate driving signal output terminal and the second clock signal terminal under the control of the potential of the second pull-up node, to control the second gate driving signal output terminal to output an invalid voltage;

in the first output phase, a valid voltage being inputted by the second clock signal terminal, and controlling, by the second gate driving signal output circuit, the connection of the second gate driving signal output terminal and the second clock signal terminal under the control of the potential of the second pull-up node, to control the second gate driving signal output terminal to output an invalid voltage;

in the second output phase, a valid voltage being inputted by the first clock signal terminal, and controlling, by the first gate driving signal output circuit, the connection of the first gate driving signal output terminal and the first clock signal terminal under the control of the potential of the first pull-up node, to control the first gate driving signal output terminal to output an invalid voltage.

16. The gate driving method according to claim 12, wherein the gate driving unit further comprises a reset circuit, and the gate driving method further comprises:

setting a blank phase between two display periods, controlling, by the reset circuit, the potential of the pull-down node to be a valid voltage under the control of a blank area reset signal inputted by the blank area reset terminal.

17. A gate driving circuit, comprising a plurality of stages of the gate driving unit according to claim 1, wherein the start terminal comprises a start terminal of even-numbered rows and a start terminal of even-numbered rows, except for a first stage of gate driving unit, the start terminal of odd-numbered rows of a current stage of the gate driving unit is connected to the first gate driving signal output terminal of an adjacent previous-stage of gate driving unit, the start terminal of the even-numbered rows of a current stage of gate driving unit is connected to the second gate driving signal output terminal of an adjacent previous-stage of gate driving unit; the start terminal of the odd-numbered rows of the first-stage of gate driving unit is connected to the first start signal input terminal, and the start terminal of the even-numbered rows of the first-stage of gate driving unit is connected to the second start signal input terminal; or wherein the start terminal comprises a forward start terminal of odd-numbered rows, a reverse start terminal of odd-numbered rows, a forward start terminal of even-numbered rows, and a reverse start terminal of even-numbered rows, the gate driving unit comprises a forward scanning control terminal and a reverse scanning control terminal; except for the first-stage of gate driving unit, the forward start terminal of odd-numbered rows of a current stage of the gate driving unit is connected to the first gate driving signal output terminal of an adjacent previous-stage of gate driving unit, and the start terminal of even-numbered rows of a current stage of the gate driving unit is connected to the second gate driving signal output terminal of the adjacent previous-stage of gate driving unit; the forward start terminal of the odd-numbered rows of the first-stage of gate driving unit is connected to the first forward start signal input terminal, and the forward start terminal of the even-numbered rows of the first-stage of gate driving unit is connected to the second forward start signal input terminal; except for the last-stage of gate driving unit, the reverse start terminal of odd-numbered rows of a current stage of gate driving unit is connected to the first gate driving signal output terminal of the adjacent next-stage of gate driving unit, the reverse start terminal of the even-numbered rows of a current stage of the gate driving unit is connected to the second gate driving signal output terminal of the adjacent next-stage of gate driving unit; the reverse start terminal of odd-numbered rows of the last-stage of gate driving unit is connected to the first reverse start signal input terminal, and the reverse start terminal of even-numbered rows of the last-stage of gate driving unit is connected to the second reverse start signal input terminal.

18. A display panel, comprising a display substrate, gate lines in M rows arranged on the display substrate and the gate driving circuit according to claim 17, wherein M is the total number of stages of gate driving units included in the gate driving circuit, the first gate driving signal output terminal of the m-th stage of gate driving unit of the gate driving circuit is connected to a gate line in the (2m-1)th row;

the second gate driving signal output terminal of the m-th stage of gate driving unit of the gate driving circuit is connected to a gate line in (2m)th row;

M is an integer greater than 1, and m is a positive integer less than or equal to M.

19. A display panel, comprising a display substrate, gate lines in M rows arranged on the display substrate and two gate driving circuits according to claim 17, wherein M is the total number of stages of gate driving units included in the gate driving circuit, the first gate driving signal output terminal of the m-th stage of gate driving unit of the first gate driving circuit is connected to a left terminal of the gate line in the (2m-1)th row;

the second gate driving signal output terminal of the m-th stage of gate driving unit of the first gate driving circuit is connected to a left terminal of the gate line in the (2m)th row;

the first gate driving signal output terminal of the m-th stage of gate driving unit of the second gate driving circuit is connected to a right terminal of the gate line in the (2m-1)th row; and the second gate driving signal output terminal of the m-th stage of gate driving unit of the second gate driving circuit is connected to a right terminal of the gate line in the (2m)th row;

M is an integer greater than 1, and m is a positive integer less than or equal to M.

* * * * *